(12) United States Patent
Crozier et al.

(10) Patent No.: US 8,352,840 B2
(45) Date of Patent: Jan. 8, 2013

(54) EVENT CLEANUP PROCESSING FOR IMPROVING THE PERFORMANCE OF SEQUENCE-BASED DECODERS

(75) Inventors: Stewart Crozier, Boulder, CO (US); Kenneth Gracie, Ottawa (CA)

(73) Assignee: Her Majesty The Queen in Right of Canada, As Represented by The Minister of Industry, Through The Commincations Research Centre Canada, Ottawa (CA)

( * ) Notice: Subject to any disclaimer, the term of this patent is extended or adjusted under 35 U.S.C. 154(b) by 901 days.

(21) Appl. No.: 12/411,066

(22) Filed: Mar. 25, 2009

(65) Prior Publication Data

US 2009/0249165 A1 Oct. 1, 2009

Related U.S. Application Data

(60) Provisional application No. 61/039,180, filed on Mar. 25, 2008.

(51) Int. Cl.
*H03M 13/00* (2006.01)
(52) U.S. Cl. ........................................................ 714/780
(58) Field of Classification Search ................. 714/755, 714/786, 794
See application file for complete search history.

(56) References Cited

U.S. PATENT DOCUMENTS

| | | | |
|---|---|---|---|
| 5,446,747 A | 8/1995 | Berrou | 714/788 |
| 5,761,248 A | 6/1998 | Hagenauer et al. | 375/340 |
| 6,654,926 B1 * | 11/2003 | Raphaeli et al. | 714/780 |
| 6,691,263 B2 * | 2/2004 | Vasic et al. | 714/709 |
| 6,799,294 B1 * | 9/2004 | Chung et al. | 714/786 |
| 6,807,239 B2 * | 10/2004 | Sugimoto et al. | 375/341 |
| 6,865,708 B2 | 3/2005 | Wang | 714/785 |
| 6,990,627 B2 * | 1/2006 | Uesugi et al. | 714/794 |
| 7,196,999 B2 * | 3/2007 | Hattori et al. | 369/59.22 |
| 7,203,893 B2 | 4/2007 | Kerr et al. | 714/780 |
| 7,219,290 B2 * | 5/2007 | Kishino | 714/755 |
| 7,260,766 B2 | 8/2007 | Levy et al. | 714/780 |
| 7,565,594 B2 * | 7/2009 | Dominique et al. | 714/755 |
| 7,805,664 B1 * | 9/2010 | Yang et al. | 714/794 |
| 7,966,545 B2 * | 6/2011 | Cho et al. | 714/755 |
| 7,978,793 B2 * | 7/2011 | Anekoji | 375/341 |
| 7,986,752 B2 * | 7/2011 | Nikopour-Deilami et al. | 375/341 |
| 8,015,499 B2 * | 9/2011 | Kanaoka | 715/780 |
| 8,036,289 B2 * | 10/2011 | Ryoo et al. | 375/260 |

OTHER PUBLICATIONS

Kerr et al., "Performance of a 4-State Turbo Code with Data Puncturing and a BCH Outer Code", 23$^{rd}$ Biennial Symposium on Communications, Queen's University, Kingston, Canada, May 29-Jun. 1, 2006.

Leanderson et al., "Performance Evaluation of List Sequence MAP Decoding", IEEE Transactions on Communications, vol. 53, No. 3, Mar. 2005, pp. 422-432.

(Continued)

*Primary Examiner* — James C Kerveros
(74) *Attorney, Agent, or Firm* — Allen, Dyer, Doppelt, Milbrath & Gilchrist, P.A.

(57) ABSTRACT

The invention relates to improving the performance of sequence-based soft-output decoders using event cleanup processing, wherein combinations of potential error events are evaluated using an error detection code (EDC) to select events that produce a modified set of decisions that has no EDC detectable errors. The event cleanup method and associated event cleanup decoder enable to significantly improve the error rate performance of sequence-based decoders and/or significantly improve decoding efficiency compared to other known error cleanup methods.

22 Claims, 10 Drawing Sheets

OTHER PUBLICATIONS

Leanderson et al., "On List Sequence Turbo Decoding", IEEE Transactions on Communications, vol. 53, No. 5, May 2005, pp. 760-763.

Leanderson et al., "The Max-Log List Algorithm (MLLA)—A List-Sequence Decoding Algorithm that Provides Soft-Symbol Output", IEEE Transactions on Communications, vol. 53, No. 3, Mar. 2005, pp. 433-444.

Mouhamedou et al., "A Method for Lowering Turbo Code Error Flare Using Correction Imulse and Repeated Decoding", 4th International Symposium on Turbo Codes & Related Topics, Munich, Germany, Apr. 3-7, 2006.

Mouhamedou et al., "Improving the Error Rate Performance of Turbo Codes Using the Forced Symbol Method", IEEE Communications Letters, vol. 11, No. 7, Jul. 2007, pp. 616-618.

Narayanan, "Selective Serial Concatenation of Turbo Codes", IEEE Communications Letters, vol. 1, No. 5, Sep. 1997, pp. 136-139.

Nill et al., "List and Soft Symbol Output Viterbi Algorithms: Extensions and Comparisons", IEEE Transactions on Communications, vol. 43, No. 2/3/4, Feb./Mar./Apr. 1995, pp. 277-287.

Öberg et al., "Application of Distance Spectrum Analysis to Turbo Code Performance Improvement", *In Proceedings 35th Annual Allerton Conference on Communication, Control, and Computing*, Sep.-Oct. 1997, pp. 701-710.

Robertson et al., "Optimal and Sub-Optimal Maximum a Posteriori Algorithms Suitable for Turbo Decoding", IEEE Communications Theory, vol. 8, No. 2, Mar.-Apr. 1997, pp. 119-125.

P. Robertson et al, "A Comparison of Optimal and Sub-Optimal MAP Decoding Algorithms Operating in the Log Domain", Proceedings of the IEEE International Conference on Communications, Jun. 1995, pp. 1009-1013.

Seshradi, "List Viterbi Decoding Algorithms with Applications", IEEE Transactions on Communications, vol. 42, No. 2/3/4, Feb./Mar./Apr. 1994, pp. 313-323.

C. Berrou, A. Glavieux, and P. Thitimajshima, "Near Shannon limit error-correcting coding and decoding: Turbo-codes", *Proceedings of the IEEE International Conference on Communications*, May 1993, pp. 1064-1070.

J. Hagenauer, E. Offer and L. Papke, "Iterative decoding of binary block and convolutional codes", *IEEE Transactions on Information Theory*, vol. 42, Mar. 1996, pp. 429-445.

R. G. Gallager, "Low-density parity-check codes", *IEEE Transaction on Information Theory*, vol. 8, Jan. 1962, pp. 21-28.

L. Bahl, J. Cocke, F. Jelinek, and J. Raviv, "Optimal decoding of linear codes for minimizing symbol error rate", *IEEE Transaction on Information Theory*, vol. 7, Mar. 1974, pp. 284-287.

S. Crozier, K. Gracie and A. Hunt, "Efficient Turbo Decoding Techniques" Proceedings of the 11th International Conference on Wireless Communications (Wireless'99), Calgary, Alberta, Canada, pp. 187-195, Jul. 12-14, 1999.

K. Gracie, S. Crozier, and A. Hunt, "Performance of a low-complexity Turbo decoder with a simple early stopping criterion implemented on a SHARC processor," in Proceedings of the 1999 International Mobile Satellite Conference (IMSC'99), Ottawa, ON, Canada, Jun. 16-19, 1999, pp. 281-286.

J. Hagenauer and P. Hoeher, "A Viterbi Algorithm with Soft-Decision Output and its Applications", IEEE GLOBECOM'89, Dallas, Texas, vol. 3, paper 47.1, Nov. 1989.

A. Viterbi, "Error Bounds for Convolutional Codes and an Asymptotically optimum Decoding Algorithm", IEEE Trans. Inform. Theory, vol. IT-13, pp. 260-269, Apr. 1967; and G. Forney, "The Viterbi Algorithm", Proc. IEEE, vol. 61, No. 3, pp. 268-278, Mar. 1973.

S. Crozier, "New High-Spread High-Distance Interleavers for Turbo-Codes," in 20th *Biennial Symposium on Communications*, Queen's University, Kingston, Canada, May 28-31, 2000.

S. Crozier and P. Guinand, "Distance Upper Bounds and True Minimum Distance Results for Turbo-Codes Designed with DRP Interleavers," in *Proceedings of the 3rd International Symposium on Turbo Codes and Related Topics*, Brest, France, Sep. 1-5, 2003.

D. J. Costello Jr. and G. Meyerhans, "Concatenated turbo codes", *IEEE International Symposium on Information Theory and its Applications*, Sep. 1996, pp. 571-574.

J. D. Andersen, "Turbo codes extended with outer BCH code", *Electronics Letters*, vol. 32, Oct. 1996, pp. 2059-2060.

K. R. Narayanan and G. L. Stuber, "List decoding of turbo codes", *IEEE Transactions on Comniunications*, vol. 46, Jun. 1998, pp. 754-762.

K. Gracie and S. Crozier, "Improving the performance of 4-state turbo codes with the correction impulse method and data puncturing," in *Proceedings of the 23rd Biennial Symposium on Communications*, Kingston, Canada, Queen's University, May 29-Jun. 1, 2006.

H. Pishro-Nik and F. Fekri, "Improved decoding algorithms for low-density parity-check codes," in 3rd *International Symposium on Turbo Codes and Related Topics*, Ecole Nationale Sup'erieure des T'el'ecommunications de Bretagne, Brest, France, Sep. 1-5, 2003.

N. Varnica and M. Fossorier, "Belief-propagation with information correction: Improved near maximum-likelihood decoding of low-density parity-check codes," in *2004 IEEE International Symposium on Information Theory (ISIT 2004)*, Chicago, USA, Jun. 27-Jul. 2, 2004.

E. Papagiannis, M. Ambroze, and M. Tomlinson, "Analysis of non convergent blocks at low and moderate snr in sccc turbo schemes," in *Proc. of ESA*, Sep. 2003.

K. Gracie, A. Hunt, and S. Crozier, "Performance of turbo codes using MLSE-based early stopping and path ambiguity checking for inputs quantized to 4 bits," in 4th *International symposium on Turbo Codes and Related Topics*, Munich, Germany, Apr. 3-7, 2006.

Oscar Y. Takeshita, Oliver M. Collins, Peter C. Massey, and Daniel J. Costello, "On the Frame-Error Rate of Concatenated Turbo Codes," IEEE Transactions on Communications, vol. 49, No. 4, Apr. 2001.

\* cited by examiner

EVENT CLEANUP PROCESSING FOR IMPROVING THE PERFORMANCE OF SEQUENCE-BASED DECODERS

CROSS-REFERENCE TO RELATED APPLICATIONS

The present invention claims priority from U.S. Provisional Patent Application No. 61/039,180 filed Mar. 25, 2008, entitled "Method for Improving the Performance of Max-Log-APP Decoders and Related Iterative Decoders Using Event Cleanup and Error Detection", by Gracie et al., which is incorporated herein by reference for all purposes.

TECHNICAL FIELD

The present invention generally relates to methods and devices for decoding of encoded data, and in particular relates to improving the performance of sequence-based decoders using error detection and event clean-up.

BACKGROUND OF THE INVENTION

Error correction coding is widely used to increase the reliability of digital information that has been stored or sent across a transmission channel to a receiver. For example, error correction codes are applied in cases where data is to be transmitted without error when performing mobile communication, FAX or other data communication, and in cases where data is to be reconstructed without error from a large-capacity storage medium such as a magnetic disk or CD. A commonly used technique is to encode data symbols into a sequence of blocks of data prior to transmission or storage, adding redundant symbols to each block to assist in further data recovery. Examples of powerful error-correcting codes are turbo codes described for example in C. Berrou, A. Glavieux, and P. Thitimajshima, "Near Shannon limit error-correcting coding and decoding: Turbo-codes", Proceedings of the IEEE International Conference on Communications, May 1993, pp. 1064-1070 and U.S. Pat. No. 5,446,747, turbo product codes described for example in J. Hagenauer, E. Offer and L. Papke, "Iterative decoding of binary block and convolutional codes", IEEE Transactions on Information Theory, Vol. 42, March 1996, pp. 429-445, and low-density parity-check (LDPC) codes described for example in R. G. Gallager, "Low-density parity-check codes", IEEE Transaction on Information Theory, Vol. 8, January 1962, pp. 21-28; these articles and patents are incorporated herein by reference In many systems, an error correction code (ECC), for example, a turbo code, is supplemented with an error detection code (EDC) such as a cyclic redundancy check (CRC) code that adds additional CRC symbols to each frame prior to the ECC encoding.

FIG. 1 illustrates one common turbo-code encoder that uses two recursive systematic convolutional (RSC) encoders 100 and 104 operating in parallel, with the RSC encoder 104 preceded by an interleaver 102, and a puncturing unit 106. The same data bits $d_i = d(i)$, i.e. information bits plus possible overhead bits such as the error detection and trellis termination bits, with the index i indicating bit location in a data bit sequence, are fed into two RSC encoders 100, 104, but the interleaver 102 permutes, i.e. re-orders the data bits according to a predetermined interleaving rule before passing the data symbols/bits to the RSC encoder 104. Encoders 100 and 104 generate parity symbols $p_1(i)$ and $p_2(i)$, which are provided to the puncturing unit 106. The puncturing unit 106 punctures the parity symbols generated by the RSC encoders and, optionally, some of the source data symbols. The source symbols $d_i$ and corresponding punctured parity symbols $p_1(i)$ and $p_2(i)$ generated by the encoders 100 and 104 form encoded codewords, which in a data transmission system are provided to a modulator, which is not shown. The turbo code codewords consist of one set of data bits and the two sets of parity bits generated by the two RSC encoders 100, 104. Assuming rate ½ RSC constituent codes, the nominal overall code rate, without any puncturing, is ⅓. The puncturing unit 106 is used to achieve higher code rates by removing some of the data and/or parity symbols from the codewords.

The decoding process for such codes at a receiver or a storage data reader is usually performed in an iterative manner by exchanging soft information, often called extrinsic information, between constituent decoders. Each constituent decoder uses a soft-in/soft-out (SISO) algorithm such as the Bahl, Cocke, Jelinek and Raviv (BCJR) algorithm described in L. Bahl, J. Cocke, F. Jelinek, and J. Raviv, "Optimal decoding of linear codes for minimizing symbol error rate", IEEE Transaction on Information Theory, Vol. 7, March 1974, pp. 284-287. Versions of this algorithm are also referred to as the maximum a posteriori probability (MAP) algorithm or, in the context of soft iterative decoding, as the a posteriori probability (APP) algorithm. These algorithms and their log-domain variations, often referred to as the log-MAP, log-APP, max-log-MAP and max-log-APP algorithms, are reviewed for example in U.S. Pat. No. 7,203,893, which is incorporated herein by reference, and described in more detail for example in the following articles, which are incorporated herein by reference: P. Robertson, E. Villebrun, and P. Hoeher, "A Comparison of Optimal and Suboptimal MAP Decoding Algorithms Operating in the Log Domain", Proceedings of the IEEE International Conference on Communications, June 1995, pp. 1009-1013; P. Robertson, P. Hoeher, and E. Villebrun, "Optimal and Sub-Optimal Maximum a Posteriori Algorithms Suitable for Turbo Decoding", IEEE Communications Theory, Vol. 8, No. 2, pp. 119-125, March-April 1997; and, S. Crozier, K. Gracie and A. Hunt, "Efficient Turbo Decoding Techniques" Proceedings of the 11th International Conference on Wireless Communications (Wireless'99), Calgary, Alberta, Canada, pp. 187-195, July 12-14, 1999.

An APP decoder finds a probability of each data symbol at each symbol time given the entire received signal. Thus it also inherently provides a most likely symbol value at each symbol time given the entire received signal. The max-log-APP algorithm approximates the log-APP algorithm by using a simple "max" operation to replace a more complex operation. This provides a simpler algorithm but also degrades performance. It has been found that most of this degradation can be recovered, typically to within about 0.1 to 0.2 dB depending on the code, by simply scaling back the extrinsic information exchanged between the constituent decoders. This method is sometimes called enhanced max-log-APP decoding and described, for example, in K. Gracie, S. Crozier, and A. Hunt, "Performance of a low-complexity Turbo decoder with a simple early stopping criterion implemented on a SHARC processor," in Proceedings of the 1999 International Mobile Satellite Conference (IMSC '99), Ottawa, ON, Canada, Jun. 16-19, 1999, pp. 281-286, which is incorporated herein by reference.

Another SISO algorithm is the soft output Viterbi algorithm (SOVA) derived from the original soft-in/hard-out Viterbi algorithm and described, for example, in J. Hagenauer and P. Hoeher, "A Viterbi Algorithm with Soft-Decision Output and its Applications", IEEE GLOBECOM '89, Dallas, Tex., Vol. 3, paper 47.1, November 1989. The SOVA algorithm was more commonly used in concatenated coding schemes prior to the advent of the iterative turbo decoding. The SOVA algorithm is related to, and has some properties similar to, the max-log-APP algorithm, but is generally considered inferior, partly due to the use of a finite-length history update window. In contrast with the APP decoder that is symbol-based, the SOVA and max-log-APP decoders are sequence-based, i.e. they search for a "most likely" sequence, i.e. the sequence that was most likely transmitted given the received signal.

The error rate performance of an error correction code in a data transmission system with noise is typically characterized by a dependence of an error rate parameter, such as the bit error rate (BER), on the signal-to-noise ratio (SNR). Typically, the BER vs. SNR curve has two important regions, namely the waterfall region and the error flare region. The waterfall region is associated with low to moderate SNR values. In this region, the slope of the error-rate curve drops rapidly as the SNR increases.

The error flare region is associated with moderate to high SNR values. In this region, the error-rate curve suffers from flattening or flaring, making it difficult to further improve the error rate performance without a significant increase in the SNR. In the error flare region, where the error rate performance is mainly determined by the distance properties of the code, the natural way to lower the error flare is to increase the minimum distance $d_{min}$ of the code and/or reduce the number of codewords (multiplicities) near $d_{min}$. A high codeword distance, typically defined as the Hamming distance, is desirable for both lowering the error flare and for making the flare region of the BER vs. SNR curve as steep as possible. Hamming distance is the minimum number of symbols that must be changed in a code word for a first codeword to become a second codeword. The further apart two codewords are, the more a signal can be corrupted while retaining the ability for the decoder to properly decode the message. It is also important to reduce the number of codewords at or near the minimum distance. A practical and common way to improve the distance properties is to use a well-designed interleaver. However, the design of such interleavers is not a simple task and there are theoretical and practical limits to the $d_{min}$ and multiplicity values, and thus the improvements in flare performance, that can be achieved.

It has been observed that in the flare region the number of information bit errors per packet error that remain after turbo decoding is usually small. Based on this observation, several authors have proposed the serial concatenation of a turbo code and a high rate algebraic outer code to improve the flare performance. The overhead and corresponding reduction in code rate is usually small for large blocks, but can still be quite significant for small or even moderate sizes of a few thousand bits. Costello et al. in an article entitled "Concatenated turbo codes", *IEEE International Symposium on Information Theory and its Applications*, September 1996, pp. 571-574, proposed the use of a Reed-Solomon (RS) outer code, whereas Andersen in "Turbo codes extended with outer BCH code", *Electronics Letters*, Vol. 32, October 1996, pp. 2059-2060, proposed the use of a Bose, Chaudhuri, and Hocquenghem (BCH) outer code. In contrast to Andersen's method where the BCH outer code protects the entire packet of information bits, Narayanan et al. in an article "Selective Serial Concatenation of Turbo Codes", *IEEE Communications Letters*, Vol. 1, September 1997, pp. 136-139, proposed to use the BCH outer code to protect only a few error prone positions in the information packet. These positions are typically the ones associated with the lowest distance codewords. However, the better the interleaver design and/or the more powerful the desired cleanup code, the less effective this method becomes, and the more it must approach that of Andersen's method where the entire data block is protected by the BCH outer code. Additional BCH cleanup results for turbo codes with data puncturing were reported by R. Kerr, K. Gracie, and S. Crozier, in "Performance of a 4-state turbo code with data puncturing and a BCH outer code," in 23rd *Biennial Symposium on Communications*, Kingston, Canada, May 29-Jun. 1, 2006, Queen's University.

Motivated by the observation that in the flare region the distance between the estimated codeword and the transmitted codeword is usually close to $d_{min}$ for most packet errors, especially when random interleavers are used, Öberg introduced a method for lowering the error flare based on distance spectrum analysis, see M. Öberg and P. H. Siegel, "Application of distance spectrum analysis to turbo code performance improvement", *In Proceedings 35$^{th}$ Annual Allerton Conference on Communication, Control, and Computing*, September-October 1997, pp. 701-710. Öberg's method identifies positions in the data block associated with the lowest distances, and then a modified turbo code encoder inserts dummy bits in these positions. Consequently, the turbo decoder knows the positions and the values of these dummy bits. The insertion of these dummy bits lowers the code rate, but it also removes the contribution of the lowest distances to the error rate performance. Again, this method is not suitable for most well-designed interleavers, and/or significant cleanup, because too many bits need special protection and the loss in code rate is not acceptable.

Seshadri and Sundberg introduced two list Viterbi algorithm (LVA) decoding methods capable of producing an ordered list of the Z globally best candidate paths through a trellis, as described in N. Seshadri and C.-E. W. Sundberg, "List Viterbi decoding algorithms with applications", *IEEE Transactions on Communications*, Vol. 42, February 1994, pp. 313-323. The first algorithm is referred to as the parallel LVA (PLVA) and produces simultaneously the Z best candidate paths. The second algorithm is referred to as the serial LVA (SLVA) and produces the next best candidate path based on the knowledge of the previously found best candidate paths. The LVA approaches are applicable to any concatenated communication system with an outer error detecting code and an inner code that can be represented and decoded using a single trellis. Since the SLVA produces the next best candidate path only if errors are detected in all previous best candidate paths, it tends to have lower average computational complexity than the PLVA. Furthermore, the PLVA requires more memory than the SLVA. Thus, the SLVA is usually recommended. In either case, both LVA approaches require modifications to the original Viterbi algorithm (VA) that increases both its memory and complexity. When applied to an inner code that can be represented by a single trellis, the LVA approach is optimal in the sense that it always finds the Z best candidate paths through the trellis. The complexity is reasonable for small lists but the peak complexity can get very high for large lists.

Narayanan and Stüber applied the LVA to the decoding of turbo codes where a cyclic redundancy check (CRC) code was used as the outer error detecting code and a turbo code was used as the inner code; see K. R. Narayanan and G. L. Stuber, "List decoding of turbo codes", *IEEE Transactions on Communications*, Vol. 46, June 1998, pp. 754-762. The turbo code was implemented in the usual manner with two parallel RSC constituent codes and an interleaver to permute the data bits. The turbo decoder was also implemented in the usual manner using SISO iterative decoding. If errors were detected after the turbo decoding was complete then the LVA was invoked. The LVA was applied to one of the two constituent RSC code trellises using the last set of extrinsic information from the other RSC code decoder as a priori information. While this approach does work well, at least for small lists, it is not a globally optimum approach because the LVA can only be applied to one of the constituent RSC code trellises at a time, so that it may not find the Z globally best paths for the entire turbo code structure. Again, the peak complexity of the method can be very high for large lists.

Another method to improve the performance of turbo codes was also disclosed by Narayanan and Stuber in the same article. This method, referred to as the "$2^k$ method", is a simple form of "bit flipping" where all combinations of k weakest bits are checked to see if the EDC can be satisfied. The k weakest bits are determined from the magnitudes of the soft output values. The operating scenario was the same as that used for the LVA method mentioned above. That is, if errors were detected after the turbo decoding was complete then the "$2^k$ method" was applied to one of the two data sequences at the output of the two constituent decoders. This $2^k$ bit flipping method was proposed and used earlier for cleaning up conventional convolutional codes decoded using the SOVA algorithm by C. Nill and C. W. Sundberg, "List and soft symbol output Viterbi algorithms: Extensions and comparisons", IEEE Trans. Commun., Vol. 43, No. 2-4, pp. 277-287, February-April 1995.

This article also teaches using channel interleaving to break up the correlated weak bits so that a simple form of bit flipping and/or LVA processing can be used.

A number of other list-sequence (LS) decoding approaches have been proposed by Leanderson and Sundberg and also applied to the decoding of turbo codes. LS maximum a posteriori probability (LS-MAP) decoding is disclosed by C. F. Leanderson and C.-E. W. Sundberg, in articles "Performance evaluation of list sequence MAP decoding", *IEEE Transactions on Communications*, Vol. 53, March 2005, pp. 422-432, and "On List Sequence Turbo Decoding", IEEE Transactions on Communications, Vol. 53, May 2005, pp. 760-763. This approach basically combines the operations of soft MAP decoding and hard LVA decoding into a single integrated algorithm. The LS-MAP algorithm may be applied during each MAP decoding step of the iterative turbo decoder. Similar optimum and sub-optimum max-log list algorithm (MLLA) methods based on max-log-MAP decoding are presented by the same authors in C. F. Leanderson and C.-E. W. Sundberg, "The max-log list algorithm (MLLA)—A list sequence decoding algorithm that provides soft symbol output", *IEEE Transactions on Communications*, Vol. 53, March 2005, pp. 433-444. Again, these approaches have a very high peak complexity for large lists and are not optimal when applied to turbo codes because the LS decoding can only be applied to one of the constituent RSC code trellises at a time.

Yet another approach to improving the error performance of turbo codes, which is referred to as the correction impulse method (CIM) or the forced symbol method (FSM), has been disclosed in Y. Ould-Cheikh-Mouhamedou, S. Crozier, K. Gracie, P. Guinand, and P. Kabal, "A method for lowering Turbo code error flare using correction impulses and repeated decoding," in 4th International Symposium on Turbo Codes and Related Topics, Munich, Germany, April 3-7, 2006; K. Gracie and S. Crozier, "Improving the performance of 4-state turbo codes with the correction impulse method and data puncturing," in Proceedings of the 23rd Biennial Symposium on Communications, Kingston, Canada, Queen's University, May 29-Jun. 1, 2006, and Y. Ould-Cheikh-Mouhamedou and S. Crozier, "Improving the error rate performance of turbo codes using the forced symbol method," IEEE Commun. Letters, pp. 616-618, July 2007. This method uses an EDC, such as a CRC code, and repeated decoding. In this method, the entire iterative decoding process, or a significant portion of it, is repeated with one or more of the weakest data symbols forced to change. This process is repeated using different weak data symbols until the EDC is satisfied or until a maximum number of decodings is reached. The improvement in error rate performance provided by this method is significant, especially in the error flare region, and the average processing is also typically quite low, at least in the error flare region. Similar methods have also been applied to the iterative decoding of LDPC codes and serial-concatenated turbo codes (SCTC). The main drawback of these methods is that the peak processing can be very high due to the repeated iterative decoding, which makes them unsuitable for delay sensitive and/or memory efficient applications due to excessive buffering when the maximum number of decodings is high.

An object of the present invention is to provide a method for improving the performance of sequence-based decoders that overcomes at least some of the deficiencies of the prior art by reducing the error rate in the flare region without significantly raising the decoder complexity, and an apparatus implementing such method.

SUMMARY OF THE INVENTION

In accordance with the invention, a method is provided for decoding data that has been encoded using an error detection code (EDC) and an error correction code (ECC) to generate a codeword from K data symbols, wherein K>1, in an apparatus comprising data processing hardware comprising a sequence-based soft output (SBSO) decoder corresponding to the ECC for decoding the data, an error detector for detecting errors in decoded data, and memory for storing the decoded data. The method comprises: a) obtaining from a data receiver a set of received signal samples representing the codeword; b) transforming the set of received signal samples into decoded data using the SBSO decoder, the decoded data comprising a decision data set d of K hard decisions $d_k$ corresponding to the K data symbols, and a reliability data set R of K reliability values $R_k$ associated with the hard decisions, wherein k is a symbol location index of a data symbol in the set of K data symbols, k=1, ..., K, and saving the decision data set and the reliability data set in the memory; c) providing the decision data set d to the error detector to generate an error detector state (EDS) and, when the EDS indicates the presence of an error in the decision data set, performing the steps of: d) identifying a plurality of potential error events in the decision data set based on the stored reliability values; e) computing event combination states (ECS) for the error detector for a plurality of combinations of the potential error events; f) identifying a selected combination of the potential error events having an ECS indicating the absence of errors; g) modifying the decision data set d at location indices corresponding to the selected combination of the potential error events identified in (f) to obtain a modified decision data set; and, h) outputting the modified decision data set for rendering in a data rendering device for presenting to a user.

In accordance with another aspect of this invention, there is provided an apparatus comprising: a data receiver for receiving a data signal representing data that has been encoded using an error detection code (EDC) and an error correction code (ECC) to generate a codeword from a set of K data symbols, wherein K>1, and for obtaining therefrom a set of signal samples corresponding to the set of K data symbols; a sequence-based soft output (SBSO) decoder for generating decoded data from the set of signal samples based on the ECC, the decoded data comprising a decision data set d of decision values and a reliability data set R of reliability values corresponding thereto; an event clean-up processor (ECP) coupled to the SBSO decoder for identifying potential error events in the decision data set based on the EDC, and for generating a modified decision data set without EDC detectable errors. According to one aspect of the invention, the ECP comprises: an error detector (ED) coupled to the SBSO decoder for detecting errors in the decision data set based on the EDC; an event locator for identifying at least two potential error events, each potential error event being associated with a set of one or more locations in the decision data set; an event information memory coupled to the event locator for storing event information for each of the identified potential error events; an event combination tester (ECT) coupled to the event information memory for examining one or more event combinations comprising one or more potential error events, and for determining a selected event combination corresponding to the absence of EDC detectable errors in the decision data set; and, a decision clean-up processor (DCP) coupled to the ECT for modifying decision values corresponding to the selected event combination to generate the modified decision data set having no EDC detectable errors associated therewith.

Another feature of the present invention provides an article of manufacture comprising at least one of a hardware device having hardware logic and a computer readable storage medium including a computer program code embodied therein that is executable by a computer, said computer program code comprising instructions for performing operations for decoding data that has been encoded using an error detection code (EDC) and an error correction code (ECC) to generate a codeword from K data symbols, wherein K>1. The computer program code has distinct software modules comprising a data decoding module for implementing a method of SBSO decoding, and an event cleanup processing module comprising an error detection module. The operations defined in the computer code comprise: receiving a set of received signal samples representing the codeword; transforming the set of received signal samples into decoded data using the SBSO decoder, the decoded data comprising a decision data set d of K hard decisions $d_k$ corresponding to the K data symbols, and a reliability data set R of K reliability values $R_k$ associated with the hard decisions, wherein k is a symbol location index of a data symbol in the set of K data symbols, k=1, . . . , K, and saving the decision data set and the reliability data set in the memory; providing the decision data set d to the error detector to generate an error detector state (EDS) and, when the EDS indicates the presence of an error in the decision data set, performing the steps of: identifying a plurality of potential error events in the decision data set based on the stored reliability values, computing event combination states (ECS) for the error detector for a plurality of combinations of the potential error events, identifying a selected combination of the potential error events having an ECS indicating the absence of EDC detectable errors, modifying the decision data set d at location indices corresponding to the selected combination of the potential error events to obtain a modified decision data set, and outputting the modified decision data set for rendering in a data rendering device for presenting to a user.

BRIEF DESCRIPTION OF THE DRAWINGS

The invention will be described in greater detail with reference to the accompanying drawings which represent preferred embodiments thereof, in which like elements are indicated with like reference labels, and wherein.

DETAILED DESCRIPTION

Figure 1:
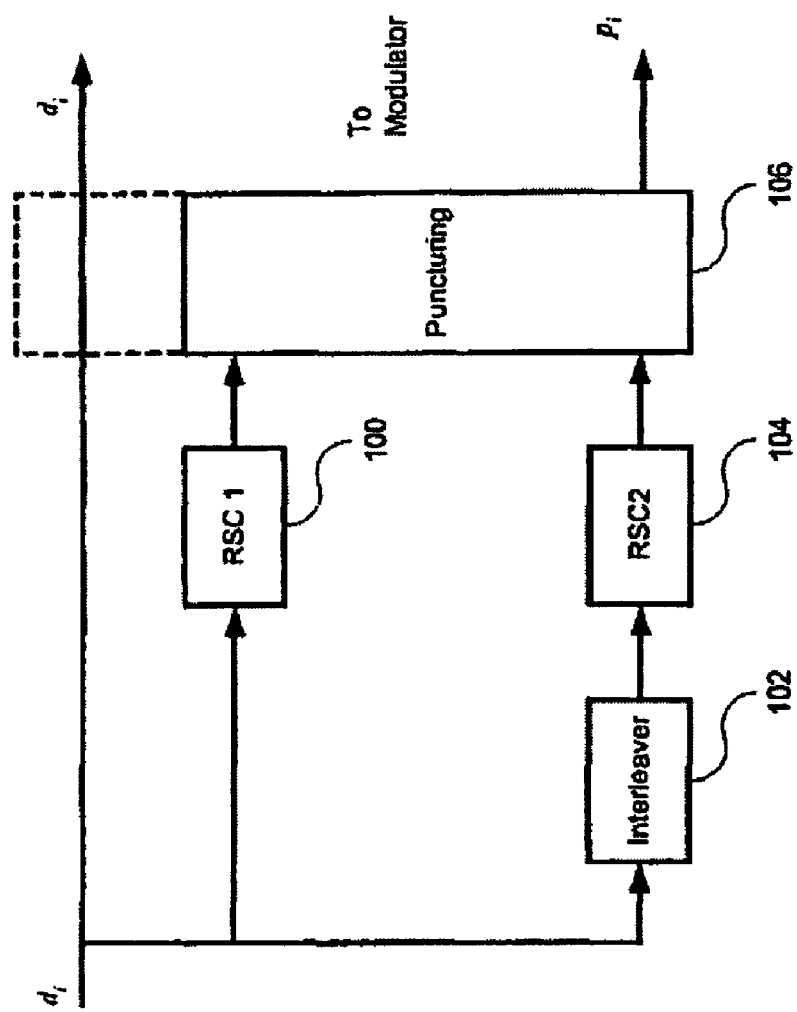
FIG. 1 is a schematic block diagram of a prior-art turbo code encoder.

The following general notations are used in this specification: upper-case or lower-case characters, e.g. X or x, may represent sequences of elements or vectors representing said sequences, with the notation x(i) or $x_i$ denoting an i-th element of a sequence of elements or a vector x, with the index 'i' representing a time sample or the element location in the sequence of elements represented by the vector x. The notation $\{x(i)\}_K$ represents a set of all elements of a vector x of length K, and also an ordered sequence of the elements x(i), i=1, . . . , K, where K is the length of the sequence. In the context of this specification the vector notation will be used to represent ordered sequences of symbols, so that an i-th symbol x(i) in a sequence $\{x(i)\}_K$, i=1, . . . , K, will also be referred to as the $i^{th}$ element of a vector x representing said sequence, so that x=$\{x(i)\}_K$. The subscript "K" in the sequence notation $\{x(i)\}_K$ will be omitted where possible without loss of clarity. The notation mod(x,y) denotes x modulo-y arithmetic, so that by way of example, mod(5,4)=1 and mod(4,4)=0.

In addition, the following is a partial list of abbreviated terms and their definitions used in the specification:
ASIC Application Specific Integrated Circuit
BER Bit Error Rate
PER Packet Error Rate
SNR Signal to Noise Ratio
DSP Digital Signal Processor
FPGA Field Programmable Gate Array
QPSK Quadrature Phase Shift Keying
BPSK Binary Phase Shift Keying
APP A Posteriori Probability
CRC Cyclic Redundancy Check
RSC Recursive Systematic Code
EDC Error Detection Code
ECC Error Correction Code In the context of this specification, the term "codeword" represents a block of encoded data, or a sequence of symbols, that is formed by an encoder from a set of data symbols to be used by a decoder for error correction decoding of the set of data symbols. A codeword of a systematic code may be formed of the set of data symbols plus parity symbols added by the encoder. The set of data symbols which is encoded by the encoder to produce the codeword typically includes information symbols and may include overhead symbols such as those added for error detection.

The term "symbol" is used herein to represent a digital signal that can assume a pre-defined finite number of states. A binary signal that may assume any one of two states is conventionally referred to as a binary symbol or bit. Notations '1' and '0' refer to a logical state 'one' and a logical state 'zero' of a bit, respectively. A non-binary symbol that can assume any one of $2^n$ states, where n is an integer greater than 1, can be represented by a sequence of n bits.

The term "symbol index" or "symbol location index" in reference to a set of data symbols or a set of decoding parameters related to the data symbols, such as hard decisions or reliabilities, refers to an integer representing the location of a data symbol or the related parameter in the corresponding set.

Unless specifically stated otherwise and/or as is apparent from the following discussions, terms such as "processing," "operating," "computing," "calculating," "determining," or the like, refer to the action and processes of a computer, data processing system, logic circuit or similar processing device that manipulates and transforms data represented as physical, for example electronic, quantities.

The terms "connected to", "coupled with", "coupled to", and "in communication with" may be used interchangeably and may refer to direct and/or indirect communication of signals between respective elements unless the context of the term's use unambiguously indicates otherwise.

One aspect of this invention relates to improving the error rate performance in a decoder that uses a sequence-based soft output (SBSO) decoding algorithm, such as the max-log-APP processing, in the decoding of data that have been encoded using a linear error correction code (ECC). If an error is detected using an error detection code (EDC), such as an embedded cyclic redundancy check (CRC) code, or any other linear constraint that can be used to detect errors, then adding a combination of weak potential error events to the initial decision sequence is examined to determine whether alternate decision sequences, which correspond to the additions of the event combinations, result in errors. The approach, which is referred to herein generally as event cleanup decoding, or as event cleanup processing in the context of post-processing of decoded data to reduce EDC detectable errors, provides an efficient way to examine a plurality of likely alternate decision sequences to eliminate EDC detectable errors. To the best of our knowledge, none of the prior art decoding methods makes use of the event combinations to represent a simple list of alternate decision sequences that can be used in coordination with error detection to improve performance.

In the following description, reference is made to the accompanying drawings which form a part thereof and which illustrate several embodiments of the present invention. It is understood that other embodiments may be utilized and structural and operational changes may be made without departing from the scope of the present invention. The drawings include flowcharts and block diagrams. The functions of the various elements shown in the drawings may be provided through the use of dedicated data processing hardware such as but not limited to dedicated logical circuits within a data processing device, as well as data processing hardware capable of executing software in association with appropriate software. When provided by a processor, the functions may be provided by a single dedicated processor, by a single shared processor, or by a plurality of individual processors, some of which may be shared. The term "processor" should not be construed to refer exclusively to hardware capable of executing software, and may implicitly include without limitation, logical hardware circuits dedicated for performing specified functions, digital signal processor ("DSP") hardware, application specific integrated circuits (ASICs), field-programmable gate arrays (FPGAs), read-only memory ("ROM") for storing software, random access memory ("RAM"), and non-volatile storage.

Exemplary embodiments of the invention are described hereinbelow primarily with reference to decoding data that have been encoded using single-binary systematic turbo codes as representative error-correcting codes, although the invention can also be applied to decoding other linear error correcting codes. Turbo codes are typically implemented using two recursive systematic convolutional (RSC) encoders operating in parallel, with an interleaver and a puncturing unit, as shown in FIG. 1. The same data bits, $u=\{u_k\}$, k=1 . . . K, with elements from the binary set $\{0,1\}$, are fed into both RSC encoders 100 and 104, but the interleaver 102 permutes the data bits before entering the second RSC encoder 104. The term "data bits" is used herein to refer to the information bits plus other possible overhead bits such as error detection check bits and RSC code trellis termination bits. Each codeword $x=\{x_k\}$, k=1 . . . N, of the turbo code includes one set of data bits, u, and both sets of parity bits, $p1=\{p1_k\}$ and $p2=\{p2_k\}$, generated by the two RSC encoders 100, 104. Assuming rate ½ RSC constituent codes by way of example, the nominal overall code rate, without any puncturing, is ⅓. The puncturing unit may be used to achieve higher code rates by removing some of the data and/or parity bits from the codewords. It may also be convenient, for example in the case of binary antipodal signaling such as BPSK or QPSK modulation, to represent the data and parity bits in +1, −1 format, where the binary set $\{0,1\}$ is mapped to the binary set $\{+1,-1\}$, respectively. The corresponding upper case letters will be used for this equivalent antipodal format. That is, the data bits $U=\{U_k\}$, the parity bits $P1=\{P1_k\}$ and $P2=\{P2_k\}$, and the codeword bits $X=\{X_k\}$ are sequences corresponding to the sequences u, p1, p2, and x, respectively, and all have elements from the corresponding binary set $\{+1,-1\}$. This correspondence is to be understood in the following description.

For many linear codes, such as turbo and turbo-like codes that are constructed using multiple constituent codes, codewords having the lowest Hamming weight are constructed from combinations of a small number of low-weight constituent code events. Low-weight constituent code events are generated by the encoder from short low input-weight (IW) data patterns that are self-terminating. Using the all-zero codeword as a reference, a self-terminating data pattern is a pattern of 0's and 1's that causes the constituent encoder to depart from the zero-state with the first data 1 and return to the zero-state at or shortly after the last data 1. Note that non-zero parity bits can only be generated while the encoder is out of the zero-state. With non-recursive constituent codes, all short low IW data patterns are self-terminating and thus generate relatively low-weight constituent code events. However, with recursive constituent codes the number of low IW self-terminating data patterns is significantly reduced. This is one reason why turbo codes are usually constructed using RSC codes. Further, with well-designed interleavers such as high-spread interleavers described in S. Crozier, "New High-Spread High-Distance Interleavers for Turbo-Codes," in 20th *Biennial Symposium on Communications*, Queen's University, Kingston, Canada, May 28-31, 2000 and S. Crozier and P. Guinand, "Distance Upper Bounds and True Minimum Distance Results for Turbo-Codes Designed with DRP Interleavers," in *Proceedings of the 3rd International Symposium on Turbo Codes and Related Topics*, Brest, France, Sep. 1-5, 2003, the lowest weight turbo code codewords almost always involve multiple low-weight constituent code events in both the non-interleaved and interleaved data vectors.

Figure 2:
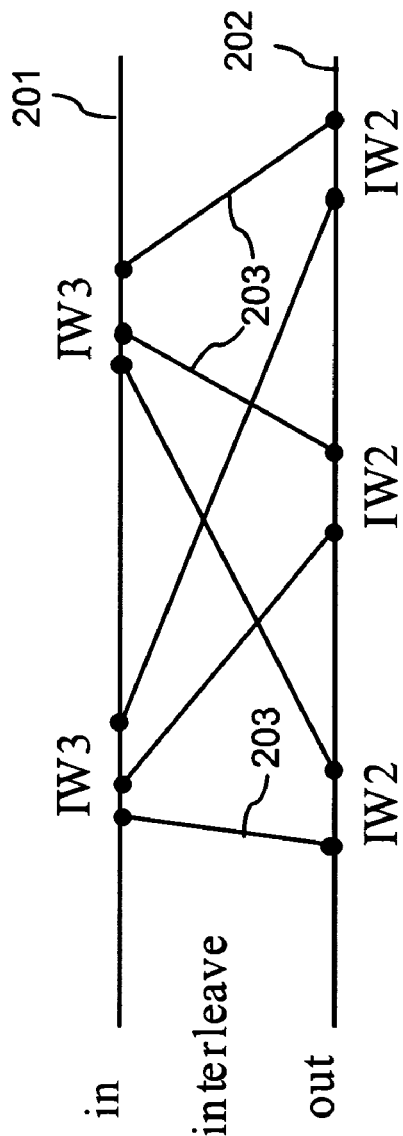
FIG. 2 is a diagram representing interleaving of a data sequence having two input weight 3 events.

FIG. 2 illustrates an exemplary case of a transformation of a low-weight data pattern by the interleaver 102. Herein, the term "data pattern" means a sequence of data bits or, generally, data symbols, having a particular combination of "ones" and "zeros". In the shown example, a data pattern that enters the interleaver 102 is represented by a line 201 with "ones" indicated as black dots, and a data pattern that is generated by the interleaver 102 from the data pattern 201 is represented by a line 202 with "ones" again indicated as black dots. Lines 203 indicate the positional shifting of the "ones" from the input data pattern 201 by the data shuffling action of the interleaver 102.

The transformation of an input low-weight data pattern by an interleaver can be described using a notation IWa:b,c, containing three integer numbers a, b and c, where "a" denotes the total input weight of the input data pattern, and b and c indicate event combinations before and after the interleaving, i.e. b is an integer number wherein each digit denotes the IW of a single constituent code event before the interleaving, and c is an integer number wherein each digit denotes the IW of a single constituent code event in the data pattern after the interleaving. The notation IWd is used to mean an input weight of d. As discussed above, an "event" refers to an encoder leaving the zero-state and returning to the zero-state in response to a specific data pattern. Thus, each event is defined by a data pattern that causes the event. Equivalently, each event can be defined by a set of location indices that corresponds to the locations of the logical "ones" within the data pattern that causes the event. By definition, events are said to be self-terminating because they cause the encoder to return to the zero-state.

The case illustrated in FIG. 2 can be denoted with a case label IW6:33,222, where the first number, 6, is the total IW of the data pattern 201, and the second and third numbers, 33 and 222, indicate the event combinations before and after the interleaving, where each digit is the IW of a single constituent code event. In this example, the non-interleaved input data pattern 201 consists of two input-weight-3 (IW3) events, and the interleaved input pattern 202 consists of three IW2 events. Generally, a high spread constraint in the interleaver does not eliminate such patterns. For example, when tail-biting and/or proper trellis termination is used to form the input data patterns to an encoder using RSC constituent codes, all events must have an IW of at least two, and it is not uncommon to have low-weight turbo code codewords involving constituent code events with input weights from 2 to 6. Furthermore, it is not uncommon to have total input weights ranging from 4 to 12, and sometimes even as high as 18, as in cases such as, IW4,22,22, IW12:444,3333, IW18:666,333333, and many others.

With RSC constituent codes, any specific input data pattern can be examined to check if it is self-terminating, without running it through the encoder. An RSC code is defined by its memory, m, and its feedback (FB) and feedforward (FF) polynomials. By way of example we consider here codes with maximal-length FB polynomials, which usually provide the best performance. In this case, after an input of a single '1' followed by '0's, the output parity pattern and the encoder state sequence both repeat with a period of $z=2^m-1$. Therefore, an input-weight-1 (IW1) data pattern cannot be self-terminating. An IW2 data pattern can only be self-terminating if the two 1's are a multiple of z symbols apart. As a first example, consider a 2-state RSC code with memory parameter m=1 and (FB,FF)=(3,2) in octal. This code has period z=1. Thus, for this code any IW2 pattern of any length is self-terminating. Further, any pattern with IW>2 can be reduced to a number of separate self-terminating IW2 patterns, and a remaining IW1 pattern if necessary.

By way of further examples we consider a 4-state RSC code with memory parameter m=2 and (FB,FF)=(7,5) in octal, and an 8-state RSC code with memory m=3 and (FB, FF)=(13,15) in octal. These codes have periods of z=3 and z=7, respectively. Again, any IW2 data pattern with its two 1's a multiple of z symbol spaces apart is self-terminating, and any other spacing is not.

consider further an IW3 data pattern generally defined by data indices (i,j,k) {i,j,k} specifying locations of the three "1"'s in the data pattern. If i and j are not a multiple of z apart, and thus the pair {i, j} is not self-terminating, then this pair can be replaced with an equivalent single index, i', that would put the encoder into the same repeating state sequence, after index j. In general, the equivalent index for pair {i, j} is given by the following equation (1)

$$i'=i+f(j-i) \quad (1)$$

where f(n) is an equivalent offset function for initial offset n=j−i, and is given by $$f(n)=g(\mathrm{mod}(n,z)), \quad (2)$$

where g(n), n=0, . . . , z−1, is a permutation of {0,1 . . . z−1} that depends on the code. For the exemplary 4-state RSC code specified hereinabove, g(n) is easily determined from the code and is defined by $$g(n)=0, 2, 1, \text{ for } n=0, 1, 2, \text{ respectively.} \quad (3)$$

For the exemplary 8-state RSC code specified hereinabove, g(n) is defined by $$g(n)=0, 5, 3, 2, 6, 1, 4, \text{ for } n=0, 1, 2, 3, 4, 5, 6, \text{ respectively.} \quad (4)$$

The function f(n) enables examining whether the IW3 data pattern is self-terminating given the location indices i,j, and k of '1's in the pattern. If f(j−i) equals zero then the pair {i,j} is self-terminating. If f(j−i) is not equal to zero then the pair {i,j} can be replaced with equivalent index i'=i+f(j−i), and now pair {i',k} can be tested. If f(k−i') equals zero then the pair {i',k} is self-terminating, and thus the original triplet {i,j,k} is self-terminating. Otherwise, it is not.

The equivalent offset function f(n), which is easily determined from the code, may be recursively applied to any input pattern of any IW≧2 to determine if the pattern, or any sub-pattern, is self-terminating. It follows that this simple function can also be used to determine extra indices, i.e. indices of zero bits that have to be changed to 'ones' to convert non-terminating data patterns into self-terminating data patterns. This is also very useful, as discussed further hereinbelow.

Since turbo codes are linear, the Hamming distance between codewords of a turbo code is determined by the Hamming weight distribution of the codewords themselves. If a true maximum likelihood (ML) decoder could be applied to the entire received signal corresponding to a transmitted turbo code codeword, X, it would pick the most likely transmitted codeword. That is, assuming equally likely codewords and an additive white Gaussian noise (AWGN) channel, an ML decoder would pick the codeword, X', closest (in a Euclidean distance sense) to the received signal. Equivalently, in the case of binary antipodal signaling, an ML decoder would pick a codeword that has the highest correlation with the received signal. When the ML decoder makes a mistake and selects an incorrect codeword x', the selected codeword x', is also usually close, in a Hamming distance sense, to the correct transmitted codeword, x. Thus, for a high enough SNR, the ML decoder error patterns would tend to look like combinations of low-weight constituent code events such as those shown in FIG. 2, for example. Although a practical turbo code decoder is not a true ML decoder but is only a pseudo-ML decoder based on sub-optimal SISO iterative processing, error patterns in the output thereof are often, but not always, similar to those for a true ML decoder. However, there may also be cases where they are not, for example when the iterative processing does not converge in an allocated time interval. With the log-APP decoding of the constituent codes, there is no guarantee that self-terminating low-weight constituent code error events will even occur. With max-log-APP constituent code decoding, however, low-weight constituent code error events almost always occur, and can usually be easily recognized from the magnitudes of the soft output reliability values. This is explained in more detail hereinbelow.

While the event cleanup approach of the present invention may be beneficially used with any sequence-based decoder such as those using max-log-APP processing, it is particularly useful when applied to SISO iterative decoders, such as those used for decoding turbo and other turbo-like codes, preferably when a sequence-based, e.g. max-log-APP processing is used for at least one of its final processing stages, just prior to attempting the event cleanup. Earlier stages of processing could also use max-log-APP processing, or true log-APP processing, or enhanced max-log-APP processing, i.e. the max-log-APP processing with an extrinsic information scale factor less than one. The use of the enhanced max-log-APP processing may be attractive because the same basic decoding unit can be used at every stage and max-log-APP processing can be invoked or turned on at any stage by simply switching to an extrinsic information scale factor of exactly one, which is equivalent to the absence of scaling of extrinsic information.

Figure 3:
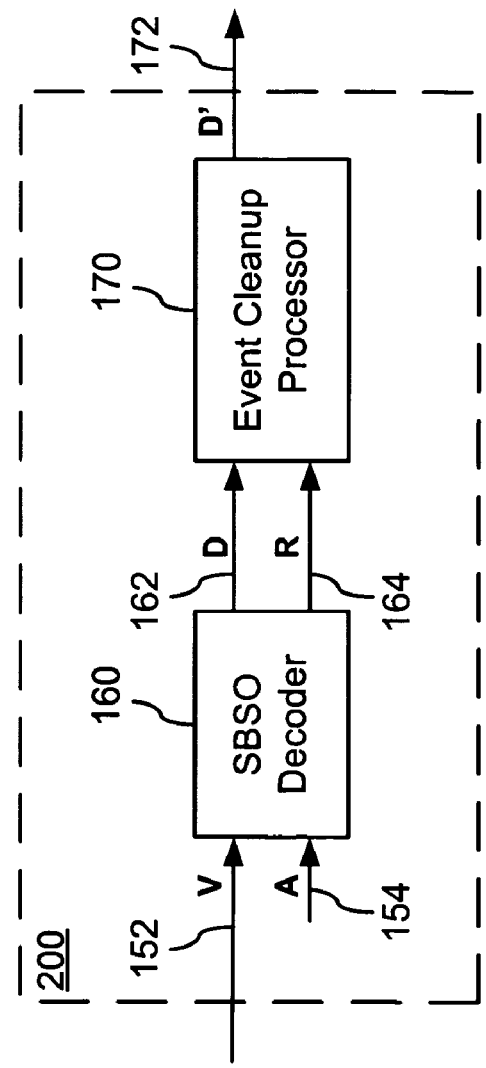
FIG. 3 is a schematic block diagram of an event cleanup decoder including an event cleanup processor.
Figure 4:
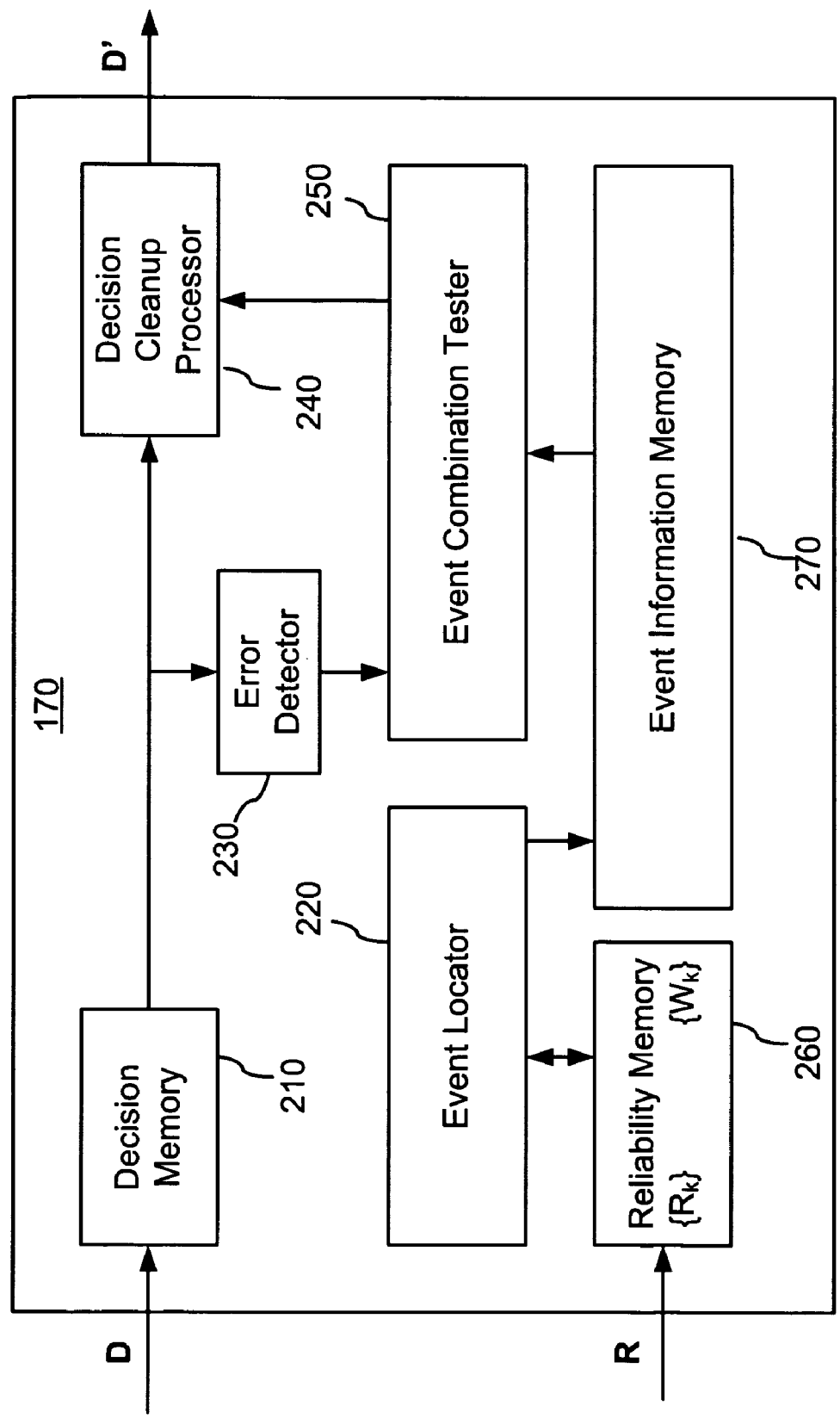
FIG. 4 is a schematic block diagram of the event cleanup processor shown in FIG. 3.
Figure 6:
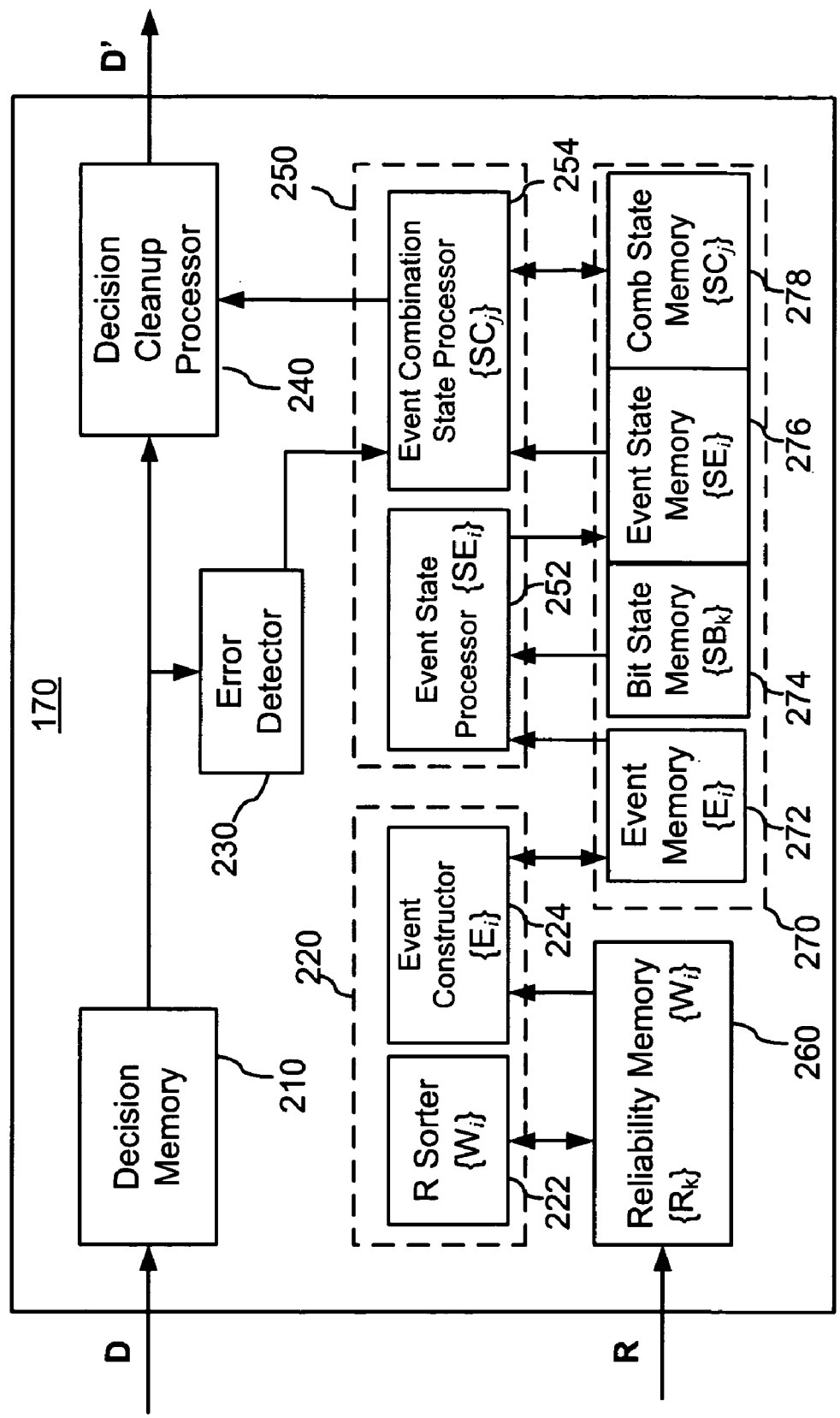
FIG. 6 is a schematic block diagram of one embodiment of the event cleanup processor shown in FIG. 4.

With reference to FIG. 3, an event cleanup decoder (ECD) 200 according to one embodiment of the present invention generally includes a sequence-based soft-output (SBSO) decoder 160, such as a max-log-APP decoder, followed by an event cleanup processor (ECP) 170, exemplary embodiments thereof are shown in FIGS. 4 and 6. In one exemplary configuration described hereinbelow more in detail with reference to FIG. 8, the SBSO decoder 160 may be a constituent decoder in a turbo-decoder configured for decoding a systematic single-binary turbo code with two RSC constituent codes such as that generated by the turbo code encoder of FIG. 1. In another non-iterative exemplary configuration, the SBSO decoder 160 may perform non-iterative decoding of the input data 152 represented by a plurality of signal samples. In exemplary embodiments described hereinbelow, the SBSO decoder 160 is a SISO (soft input, soft output) decoder implementing a max-log-APP algorithm as known in the art, and will also be referred to as the max-log-APP decoder.

The operation of the ECD 200 will now be generally described using mathematical symbols and operations as common in the art. It is however understood that the mathematical symbols and operations are used herein to assist in understanding of the invention, and that they represent real physical, such as electrical, signals that are being transformed by hardware operating on these signals to produce useful and tangible results.

In operation, the SBSO decoder 160 receives signal samples 152 representing a codeword X generated using an error detection code (EDC) and an error correction code (ECC), which may have been corrupted, for example during transmission or in storage. In one exemplary embodiment, the ECC is the turbo code implemented by the turbo code encoder of FIG. 1, and the codeword X is formed of a set of data symbols U and two sets of parity symbols P1 and P2. In other embodiments, one set or more than two sets of parity symbols may be present in addition to the set of data symbols U, or without the data symbols U. The received signal samples 152 may be represented as including a set of soft received values, $V=\{V_k\}$, k=1 ... N, each of which corresponds to a symbol in the transmitted codeword X, which however may be corrupted such as by noise. The SBSO decoder 160 may also optionally accept a set of soft a priori information values $A=\{A_k\}$, k=1 ... K, that correspond to the data symbols in the set U, as illustrated in FIG. 3 at 154. The SBSO decoder 160 may output a set of hard decisions 162 $D=\{D_k\}$, k=1 ... K, with elements $D_k$ also referred to as decision values or decisions, from a set $\{+1,-1\}$, or equivalently, decisions $d=\{d_k\}$ from a set $\{0,1\}$; the sets d and D are also referred to hereinbelow as the decision data sets. These decisions correspond to respective data symbols in the set U. The SBSO decoder 160 may also output a set of soft reliability values 164 $R=\{R_k\}$, k=1 ... K, corresponding to the hard decisions in D. The set R is also referred to hereinbelow as the reliability data set. Alternatively, the SBSO decoder 160 may output a single set of soft values $L_k$ that may be positive or negative, with the magnitude of the soft values providing the reliability values, and the sign of the soft values defining the decisions '−1' or '1'. It will be assumed hereinbelow that the decision device that makes decisions on the soft output values $L_k$ and generates the hard decision values $d_k$ and the reliability values $R_k$ is included at the output of the SBSO decoder 160, although it shall be understood that in other embodiments it may be included at the input of the ECP 170.

As discussed hereinabove, in the turbo decoder embodiment the a priori information used by one constituent decoder is derived from the reliability values produced by the other constituent decoder, usually in the form of extrinsic information. In embodiments wherein the decoding is non-iterative, the a priori information may be any known information related to codeword properties, such as the ratio of "ones" and "zeros" in the codeword, or may be absent.

The values in inputs V and A to the SBSO decoder 160 may be expressed in a log-likelihood-ratio (LLR) form and, if independent or assumed to be independent, can simply be viewed as additive information as known in the art. The reliability values in the output R may also be conveniently expressed in the LLR form, or as the magnitudes of LLRs if the sign information is already contained in D.

Let $P^0_k=\text{prob}(u_k=0|V,A)$ be the true (or approximate) probability that $u_k=0$, or equivalently $U_k=+1$, at the output of a constituent decoder given the constituent code definition and inputs V and A. Similarly, let $P^1_k=\text{prob}(u_k=1|V,A)$ be the true, or approximate, probability that $u_k=1$, or equivalently $U_k=-1$, at the output of a constituent decoder given inputs V and A. Further, let $M^0_k=\log(P^0_k)$ and $M^1_k=\log(P^1_k)$ be the corresponding log-domain metrics for these two probabilities. Then, assuming some form of true or approximate log-APP decoding, the LLRs corresponding to the outputs of the constituent decoder at any stage, or half-iteration, of decoding can be expressed as $$L_k=\log(P^0_k/P^1_k)=M^0_k-M^1_k. \qquad (5)$$

In an embodiment wherein the SBSO constituent decoder operates on binary signals, the decision values $D_k$ and reliability values $R_k$ may be defined by equations $D_k=\text{sign}(L_k)$ and $R=\text{abs}(L_k)$. That is, the decisions are based on the signs of the resulting LLRs and the soft reliability values are the absolute values or magnitudes of the LLRs. Thus, we also have that $$L_k = D_k \times R_k. \quad (6)$$

A true log-APP decoder finds the true LLR, $L_k$, for each data bit index k, given valid inputs and appropriate assumptions. There is no general requirement that the magnitude of the LLR for one data bit index have exactly the same value as the magnitude of the LLR for another data bit index. In other words, a log-APP decoder is a soft data bit estimator, not a data sequence estimator.

In a max-log-APP decoder, however, the LLRs are computed in a different and approximate manner. In particular, the metrics $M^0_k$ and $M^1_k$ in equation (5) correspond to metrics for two most likely data sequences, i.e., two most likely paths through the code trellis, that have a '0' and a '1' at the data bit index k, respectively. That is, max-log-APP decoding, which produces the decision data set d that is equal to the true ML decision sequence which we denote as d1 here, i.e. d=d1, effectively uses the soft metrics associated with entire data sequences to approximate $L_k$ and thus to obtain the soft output values. One of the two "most likely" sequences associated with index k must correspond to the true maximum likelihood (ML) sequence of decisions d1=d, having the best overall maximum metric M1, because the true ML sequence must have either a logical '0' or a '1' at index k. Thus, in the max-log-APP decoding the $L_k$ value is computed as either the positive value $(M1-M^1_k)$ for decision $d_k=0$ ($D_k=1$), or as the negative value $(M^0_k-M1)$ for decision $d_k=1$ ($D_k=-1$), with the reliability value $R_k$ being the magnitude of this result. The $D_k$ and $R_k$ values are computed in this same manner, using the overall maximum metric M1 and one other path metric, for all k.

By way of example, the max-log-APP decoder 160 effectively finds the most likely data sequence d1 that has the largest metric M1, and the second most likely data sequence d2 that has the next largest metric M2<M1. Further by way of example, let these two data sequences d1 and d2 differ at, and only at, symbol locations defined by indices i, j, and k. Then the corresponding reliability values for these bit locations $R_i$, $R_j$, and $R_k$ must all have exactly the same weakest value of W1=(M1−M2). There is no other choice because these are the two most likely data sequences, and one sequence must have a '0' and the other a '1' at each of the three symbol locations i, j, and k. Thus, the second most likely data sequence d2 is given by the most likely data sequence d1 plus (modulo 2) a weak event defined by '1''s at indices {i,j,k} and '0''s everywhere else. It is to be understood that this weak event is defined by a first set of indices E1={i,j,k}. In fact, this is the weakest event, as determined by the constituent decoder, because it corresponds to the weakest possible reliability value W1. Note that the event E1, is uniquely identified by the fact that $R_i=R_j=R=W1$, and all other reliabilities are greater than W1, assuming no zero or tied metrics for now. The distance associated with this event in the constituent code is the Hamming weight of the corresponding constituent code codeword, obtained by encoding this event. At typical operating SNRs, it is highly unlikely that a weak event, as determined by the constituent decoder, will correspond to a strong, i.e. high Hamming weight, event as determined by the constituent encoder. Thus, with RSC constituent codes, this event is almost certain to correspond to a fairly short, low IW, self-terminating data pattern, as discussed earlier.

There are several decoding scenarios that may happen with respect to the third most likely data sequence d3 having metric M3<M2. First, we consider an exemplary scenario wherein the sequences d3 and d1 differ at locations m and n, where m and n are different than i, j, and k. Then $R_m$ and $R_n$ must have the same second weakest value of W2=M1−M3. There is no other choice because the only other sequence with a stronger metric than M3 other than d1 with metric M1 is the second sequence d2 with metric M2. But, as assumed, sequence d2 does not differ from d1 at locations m and n, and thus W1 is not a candidate for $R_m$ and $R_n$. Thus, the third most likely data sequence, d3, is given by the most likely data sequence d1 plus (modulo 2) the weak event defined by a second set of indices E2={m, n}. Note that, for this "non-overlapping" case, the second weakest event, which we will denote according to the corresponding set of indices E2, is fully identified by identifying all symbol location indices for which the reliability value is equal to W2, in this exemplary case $R_m=R_n=W2$; all the other reliabilities are different. It is highly unlikely that a true weak event as determined by the constituent decoder, i.e. an event corresponding to a small reliability value compared to most other events, will correspond to a strong, i.e. having a high Hamming weight, event as determined by the constituent encoder. Thus, with RSC constituent codes, this second event is again almost certain to correspond to a fairly short, low IW, self-terminating data pattern. If it does not, and this is easily tested for, as discussed earlier, then the assumption that the events are non-overlapping is probably wrong. It has been observed that the non-overlapping scenario described hereinabove is almost certain to occur when the location indices in E1 and E2 are far apart. It is also typical, but somewhat less likely, when the indices are close together.

Now consider the case where the third most likely data sequence d3 differs from the most likely sequence d1 at locations k, m and n. That is, there is "overlap" at index k between the true weak events defined by the sets E1={i,j,k} and E2={k,m,n}. As before, E1 is completely and uniquely identified by the equality $R_i=R_j=R_k=W1$, but E2 is only partially identified by finding the set E2'={m,n} of location indices for which the reliability value is equal to the second weakest, i.e. smallest, reliability value W2, i.e. $R_m=R_n=W2$. This is because $R_k$ has already been assigned the weaker value, W1, associated with the weakest event E1, found earlier. Typically, the indices in E1 and E2' must be fairly close together for this scenario to happen. With non-recursive constituent codes there is no simple solution to this problem because E2' is always self-terminating, and thus could represent a true weak event. But, with RSC constituent codes, if E2 is self-terminating, as it must be to have low Hamming weight in the encoder, then E2' cannot be self-terminating. In fact, with RSC codes, it may be shown that an event that is one index short of a self-terminating event cannot be a self-terminating event. As described hereinabove with reference to equations (1)-(4), it is possible to examine if E2' is self-terminating. Accordingly, in the embodiment wherein the data are encoded using RSC codes, the overlapping event E2 may be identified by i) first examining E2' to discover that it is not self-terminating, and then ii) trying to find a nearby index from E1, or, generally from all previously defined weaker events, that can be used to augment the indices in E2' to form a short self-terminating event. In the exemplary case wherein E1 has only three indices, the only valid solution is to use the correct index, k. If E1 had only 2 indices, then they would have to be a multiple of period z apart, and either index would work. When there is more than one choice, the best choice is usually the index closest to E2'.

Now consider the case where the two weakest events E1={i,j,k} and E2={m,n} are close to each other, do not share any indices, and are both self-terminating. Thus, E1 is uniquely identified by equations $R_i=R_j=R_k=W1$, and E2 is uniquely identified by equations $R_m=R_n=W2$. Let M4<M3 be the path metric for the fourth most likely data sequence, d4, and suppose that E3={k,m} is the correct third weakest self-terminating event that, when added to d1, gives d4. It is clear that neither of the indices in E3 will be found using $R_k$ or $R_m$ because they have already been assigned the weaker reliability values W1 and W2, associated with events E1 and E2, respectively. Thus, E3, and correspondingly d4, cannot be found or constructed from combinations of previous events using just reliability values. Even though this example is not highly probable, it may occur and thus serves to show that there is no guarantee that the most likely data sequences can all be determined from combinations of the weakest events found using just reliability values. Thus, such an approach is clearly sub-optimal in nature. With non-recursive codes, events like E3, with all its indices shared with weaker events, are always self-terminating, and thus always a potential problem. With RSC codes, however, an arbitrary set of shared indices is less likely to form a self-terminating event, and thus less likely to be a potential problem.

Ideally, what is desired is an ordered list of data sequences where the first sequence is the most likely sequence with metric M1, the second is the second most likely sequence with metric M2<M1, the third is the third most likely sequence with metric M3<M2, etc. This is essentially what the LVA and other LS algorithms noted in the background section try to provide. However, obtaining perfectly ordered lists of many thousands of sequences is a very complex task.

A more efficient decoding approach provided by the present invention is to examine large lists of sequences that may be sub-optimally ordered and possibly incomplete, and are based on combinations of weak events that are easily identified using the reliability values in the reliability data set R. Advantageously, preferred embodiments of the decoding method of the present invention do not require the actual generation of any of these sequences, except for the initial and final decision sequence. The method simply considers the effect of various event combinations on the state of the error detection code (EDC), also referred to as the EDC state. With the event combinations tested in an efficient order, the average processing required per candidate decision sequence tested becomes trivial, as shown below. In a sense, we have traded the complexity of an "optimal" short-list approach, for the efficiency of a more practical, but sub-optimal, large-list approach. However, it should be pointed out that the LVA, and other related approaches, as applied to cleaning up turbo codes, are not really optimal. This is because they only consider one constituent code trellis and do not correctly take into account the structure of typical turbo code error patterns or the correlation between constituent code error events introduced by the iterative processing. In contrast, the approach of the present invention is advantageously well suited to finding and cleaning up combinations of several spread out weak error events, as illustrated in the top and bottom of FIG. 2, for example.

Errors in the decision data set d can be detected using a linear EDC, such as a CRC code for example. An n-bit EDC at the transmitter uses an n-bit state variable in the encoder to generate n check bits that are added to the data sequence being encoded. When the initial decisions, d, including the n check bits, are run through the same EDC encoder in the receiver, the EDC encoder, which is referred to in this case as the error detector (ED), is expected to end in the zero state. If it does not then an error is detected. Because the EDC is linear, one way to calculate this initial error detection state, SD, is to simply store the state, $SB_k$, for each bit index k in d, and then add (word XOR) these states together for every index with a non-zero bit in d. Now, suppose there are several bit errors and we guess the indices of these bit errors. The state of the EDC, which we denote SG, for this guessed set of bit indices alone can be computed by simply adding the states for each bit index together. If we guessed correctly, then SG equals SD, so that the total state will be zero when added together. The final, correct, decisions are obtained by simply flipping the bits in d at the guessed set of bit indices. If the states SG and SD are not equal then the total state is not zero and we did not guess correctly, and there is no need to modify the decision vector.

Just as the EDC state $SB_k$ can be computed and stored for each bit index, k=1 ... K, the EDC state $SE_i$ can be computed and stored for each weak event $E_i$, i=1 ... I, where $E_i$ is defined by a set of bit indices, and I is the maximum number of weak events considered. Likewise, the EDC state $SC_j$ can be computed and stored for each combination of weak events, $C_j$, j=0,1 ... (J−1); it is convenient to use j=0 to represent the empty set $C_0$={ } with $SC_0$=SD. Each combination of weak events, $C_j$, is defined by a set of event indices that consists of all indices for the events that are included in the particular event combination, and J is the maximum number of event combinations considered, including the empty set. The maximum number of weak events, I, is typically much smaller than K. Also, the number of bit indices per weak event is usually small, for example less than 10. Thus, computing the I event states, $\{SE_i\}$, from the K bit states, $\{SB_k\}$, is trivial. The maximum number J of considered event combinations may be much larger than K. Thus, computing the J event combination states (ECS) $\{SC_j\}$, from the I event states, $\{SE_i\}$, can be complex. Advantageously, this processing can be kept to a minimum by making sure that each new event combination consists of a previous event combination and one other event. We found that this requirement is easy to satisfy in practice, and usually follows naturally for well-ordered event combinations. When this is the case, each new event combination state, $SC_j$, can be computed using a single state add (word XOR) operation. Thus, for large numbers of event combinations, when J>>K, the peak event cleanup complexity is typically dominated by J, and is of order J simple operations. If at any index j, $SC_j$=0 (note that SD is already included with $SC_0$=SD), then the initial decisions, d, can be updated using the combination of events defined by $C_j$, which is termed herein as the event cleanup, and all cleanup processing can stop. Advantageously, the method may be implemented without actually storing the indices of the events that define each event combination $C_j$, as they can be easily determined when needed from the event combination index j, as described hereinbelow.

The event cleanup processing can be applied to the output of any max-log-APP decoder, or generally any SBSO decoder used to decode data that has been encoded with a linear EDC, such as the CRC code, and an ECC such as an RSC code. For binary ECC codes, the event cleanup processing of the present invention can be termed event flipping (EF) cleanup. It will be appreciated that other linear codes can also be used as the EDC, including but not limited to BCH, Extended BCH, Hamming, Extended Hamming, and RS codes.

Figure 5:
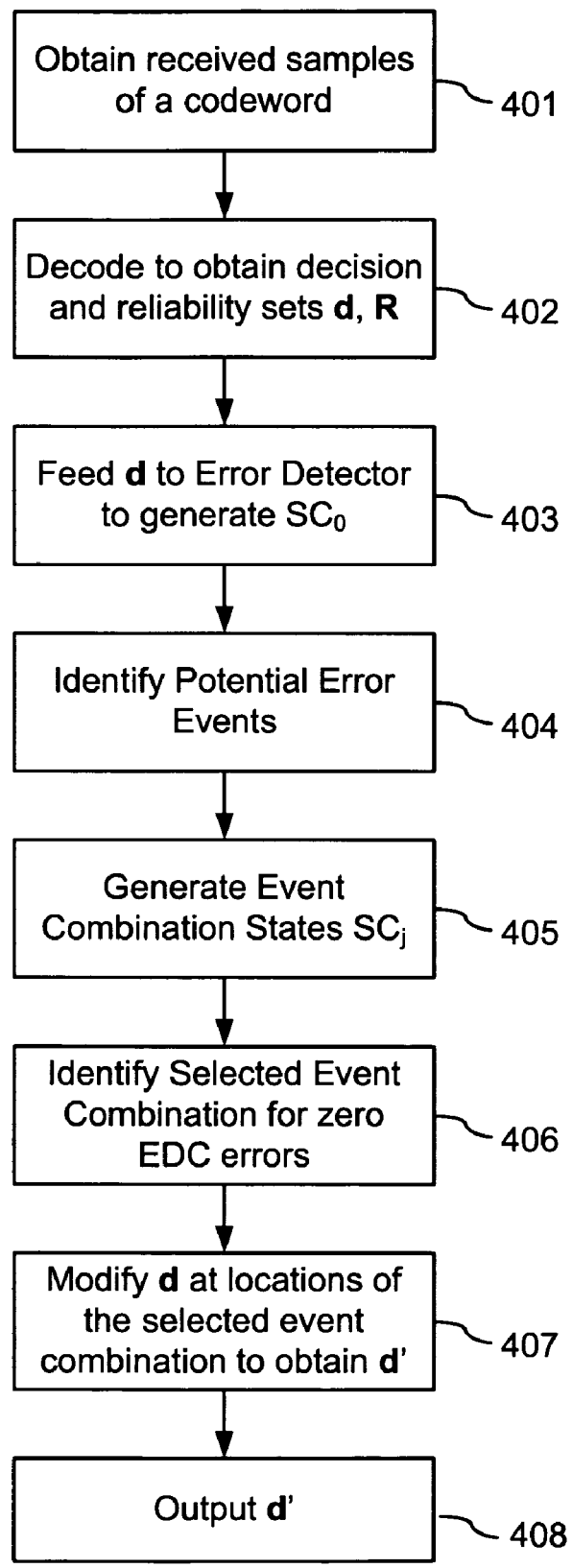
FIG. 5 is a flowchart representing general steps of a method of event cleanup decoding according to the present invention.

According to an embodiment of the present invention, the ECP 170 performs the event cleanup processing of the soft output of the SBSO decoder 160 as generally described hereinabove. The operation of the ECP 170 and its functional structure will now be described with reference to FIG. 4 and FIG. 5.

Turning first to FIG. 4, in the shown embodiment the ECP 170 has a memory buffer that includes a decision memory 210 for storing the decision data set D and a reliability memory 260 for storing the reliability data set R; in other embodiments the ECP 170 may utilize shared buffer memory of the SBSO decoder 160 instead. The decision memory 210 is coupled to an error detector 230, which utilizes a pre-defined linear EDC to detect errors in the decision data set D as described hereinabove. The reliability memory 260 is coupled to an event processor 220, also referred to herein as an event locator, which is programmed to identify at least two potential error events (PEEs) based on the reliability values $R_k$ stored in the reliability memory 260. The event locator 220 is coupled to an event information memory 270, to which it provides the event information for the identified potential error events for storing therein. An event combination tester (ECT) 250 that is coupled to the event information memory 270 is further provided for examining one or more event combinations $\{C_j\}$ comprising one or more potential error events, and for determining a selected event combination $C_j$ corresponding to the absence of EDC detectable errors in the decoded data. The ECT 250 is coupled to a decision clean-up processor (DCP) 240, which receives the decisions data set D from the decisions memory 210, or directly from the SBSO decoder 160, and modifies decision values $D_k$ corresponding to the selected event combination $C_j$ to generate the modified decision data set D' having no EDC detectable errors associated therewith.

In operation, the ECD 200 formed by the SBSO decoder 160 and the ECP 170 of FIG. 3 implements a method for decoding data according to one aspect of the present invention. This method is generally illustrated in a flowchart of FIG. 5, and includes the following general steps.

Figure 10:
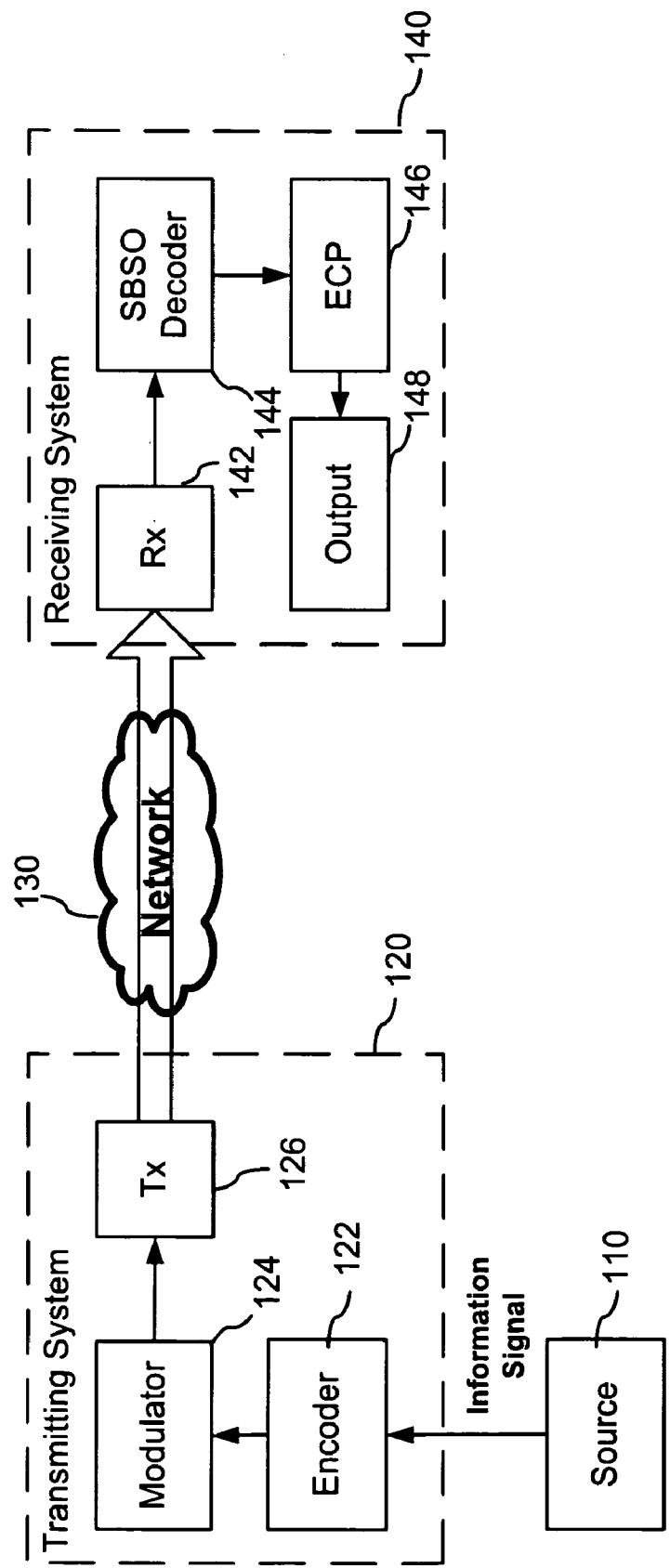
FIG. 10 is a schematic block diagram of a transmission system utilizing an event cleanup decoder of the present invention.
Figure 11:
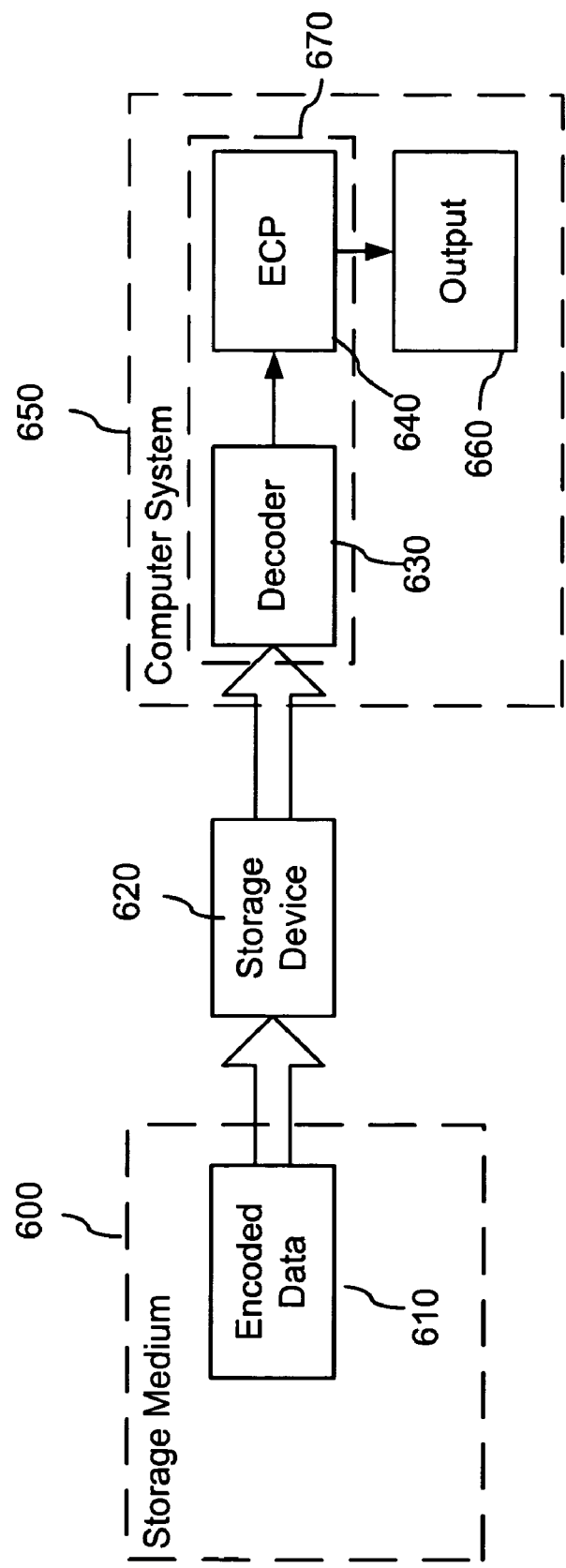
FIG. 11 is a schematic block diagram of a computer storage system utilizing an event cleanup decoder of the present invention.

In a first step 401, a set of received signal samples representing a transmitted codeword encoded from K data symbols, the K data symbols including check symbols generated by a linear EDC is obtained from a data receiver, such as the receiver 142 in the embodiment of FIG. 10 representing a data transmission system, or a storage device 620 in the embodiment of FIG. 11 representing a computer system with data storage, which are described hereinbelow.

In a step 402, the SBSO decoder 160 is utilized to transform the set of received signal samples into the decision data set d of K hard decisions $d_k$, and the reliability data set R of K reliability values $R_k$ associated therewith, wherein k is a location index, k=1, . . . , K, K, K>1, and saving the decision data set and the reliability data set in the memory.

In a step 403, the decision data set d is provided to the ED 230, which generates an EDC state that is indicative of the presence of EDC detectable errors in the decision data set d, as known in the art; if no EDC detectable error is found, the processing stops and the DCP 240 outputs the decision data set d obtained from the SBSO 160 as a final output of the method; otherwise if the EDC state at the output of the ED 230 indicates the presence of EDC detectable errors in the decision data set d obtained from the SBSO decoder 160, the generated EDC state from the ED 230 is provided to the ECT 250, which stores it in the event information memory 270 as the initial event combination state (ECS) $SC_0$ and the processing proceeds according to steps 404-408 as described herein below.

In a step 404, the event locator 220 is initiated to identify a plurality of potential error events in the decision data set d based on the reliability values $R_k$ stored in the reliability memory 260, and stores these events in the event information memory 270.

In a step 405, the event combination tester 250 computes the ECS for a plurality of combinations of the potential error events, each of which may be assigned a unique ECS index j, utilizing the event information stored in the event information memory 270, and examines each computed ECS to determine the presence or absence of EDC detectable errors in the corresponding combination of the potential error events, until a selected combination $C_j$ of the potential error events with an ECS indicating the absence of errors is identified in a step 406.

In a step 407, the DCP 240 modifies the decision data set d at symbol location indices corresponding to the selected combination $C_j$ of the potential error events as identified in the step 406 to transform the original decision data set d into a modified decision data set d'.

In a final step 408, the modified decision data set d' is output for rendering in a data rendering device for presenting to a user.

Figure 7:
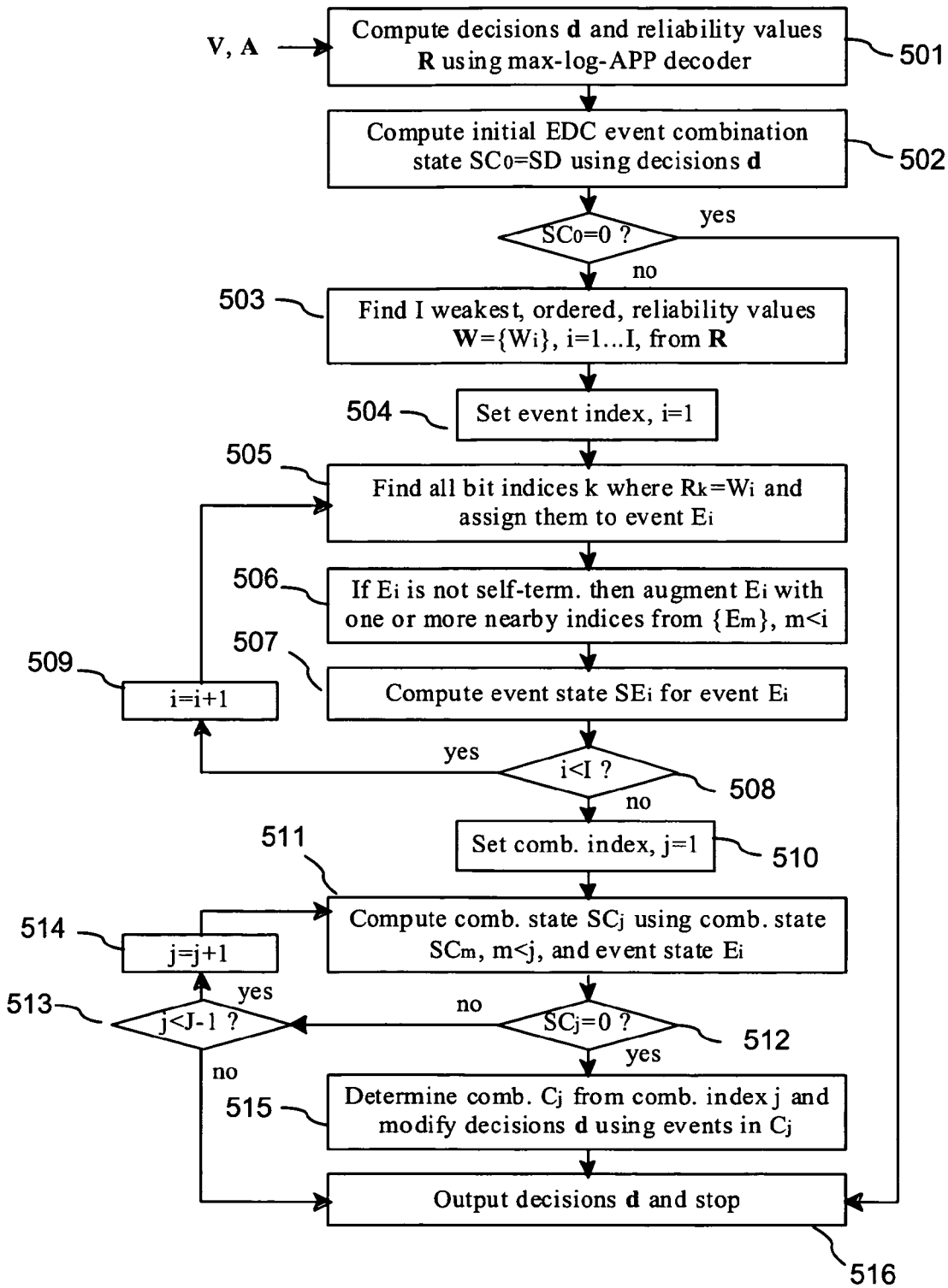
FIG. 7 is a flowchart representing logic of the event cleanup decoding according to one embodiment of the present invention.

FIGS. 6 and 7 illustrate exemplary embodiments of the ECP 170 and the method of event cleanup decoding according to aspects of the present invention in further detail. Elements in FIG. 6 having substantially the same functionality as respective elements in FIG. 4 are identified with same reference labels and their description may be omitted here to avoid unnecessary repetition.

With reference to FIG. 6, an embodiment of the ECP 170 is shown wherein the event information memory 270 includes an event memory 272 for storing data symbol locations associated with each potential error event, a bit state memory 274 for storing bit state values $SB_k$, and an event state memory 276 for storing the event state values $SE_i$, and an ECS memory 278 for storing the ECS values $SC_j$. The bit state memory 274 stores a pre-computed bit state value $SB_k$ for each bit location k=1, . . . , K in the decision data set d. Each bit state value $SB_k$ corresponds to an output of the error detector 230 in response to a binary sequence of length K and weight 1 having a single logical "1" at the respective bit location k in the binary sequence.

Further with reference to FIG. 6, the event locator 220 includes a reliability sorter 22 for selecting a plurality of I weak reliability values $W=\{W_i\}$, i=1 . . . I, from the reliability data set R, where I is at least two and at most K, for example from 10 to 100, and an event constructor 224 for identifying locations in the decision data set d associated with a selected weak reliability value to construct a potential error event $E_i$, and for providing a set $E_i$ of location indices for each potential error event to the event memory 272 for storing therein. The ECT 250 includes an event state processor (ESP) 252 for generating I event state values $SE_i$ for the potential error events $E_i$, i=1, . . . , I based on the EDC, and for storing event state values $SE_i$ in the event state memory 276. The ECT 250 further includes an event combination state (ECS) processor 254 for generating one or more ECS values $SC_j$ for the one or more event combinations $C_j$ based on combinations of the event state values $SE_i$ and an initial ECS value $SC_0$ provided by the error detector 230. The ECS processor 254 identifies a combination of potential error events corresponding to the absence of EDC detectable errors in the decoded data based on the corresponding $SC_j$, which is referred to herein as the selected event combination, and provides information about symbol locations associated with the selected event combination to the decision clean-up processor 240.

Although embodiments of the ECP 170 are illustrated in FIGS. 4 and 6, respectively, as having several separate functional elements represented by blocks, one or more of the functional elements in each embodiment may be combined with other elements of the ECP 170 and/or the SBSO decoder 160, and may be implemented by combinations of software-configured hardware elements, such as processing elements including but not limited to microprocessors, general purpose processors, DSPs, FPGAs, ASICs, discrete logic components, or any combination of such or similar purpose devices.

In some embodiments, the functional elements of the ECP 170 may refer to one or more processes operating on one or more processing elements. In some embodiments, the functional elements of the ECP 170 may be implemented in one or more field-programmable gate arrays (FPGAs).

FIG. 7 illustrates logic implemented in the ECD 200, with the ECP 170 illustrated in FIG. 6, for obtaining the modified set of decisions d' or D' that includes no EDC detectable errors. The processing utilizes two parameters, the maximum number I of weak events to be considered and the maximum number J of event combinations, which are design parameters that may be pre-selected based on requirements of a particular application, such as constraints on available memory and latency or decoding time.

Referring to FIG. 7, the control starts at block 501 with the SBSO decoder 160, which in this embodiment implements a max-log-APP decoding algorithm as described hereinabove, taking in the received values V and any a priori information A and transforming these inputs into the initial decision data set d={$d_k$} with elements $d_k$ being binary symbols or bits from the binary set {0,1}, or, equivalently, D={$D_k$} from the binary set {+1,−1}, and the reliability data set R formed of positive reliability values $R_k$, i.e. R={$R_k$}, with the sets {$d_k$} and {$R_k$} corresponding to the K transmitted data bits u={$u_k$} with elements from the set {0,1} or, equivalently U={$U_k$} with elements from the set {+1,−1}, for k=1 ... K. The ECP 170 obtains the decision data set d and the reliability data set R and stores these data sets in the memory blocks 210 and 260, respectively as described hereinabove, or utilizes internal memory of the SBSO decoder 160 storing these data sets.

At block 502, the initial EDC event combination state $SC_0$=SD is computed by the ED 230 using the initial decisions d, corresponding to empty event combination $C_0$={ }. If $SC_0$=0, i.e., no errors are detected in d, then the DCP 240 outputs the initial decision data set d, and the decoding process stops until a next set of received values is provided to the SBSO decoder 160.

Otherwise, the control is transferred at block 503 to the reliability sorter 222, which selects from R the I weak reliability values W={$W_i$}, i=1 ... I, which may be provided to the reliability memory for storing therein. In a preferred embodiment, the I weak reliability values W={$W_i$} are the I smallest reliability values, in order of increasing magnitude, from the reliability data set R, and the reliability sorter 222 finds these weak reliability values W={$W_i$} by performing a partial sorting of the reliability data set R. In other embodiments, the I weak reliability values W={$W_i$} may be selected from the reliability data set R using a different approach, for example by selecting reliability values that are less than a pre-determined threshold.

Once the I weak reliability values W={$W_i$} are selected, the control is transferred to the event constructor 224, which accesses the reliability memory 260 and performs a loop at blocks 504 to 509 to identify a plurality of I potential error events corresponding to the set of weak reliability values W={$W_i$}, i=1, ..., I. This loop starts with assigning an initial value, for example 1, to the event index i at block 504, then at block 505 accesses memory 260 to identify bit location indices k of all reliability values $R_k$ that are equal to $W_i$, and assigns these location indices to the set of indices $E_i$ that is thereby associated with an $i^{th}$ potential error event. If an RSC code was used to generate the original transmitted codeword X, the loop may include at block 506 a logic for examining each set of indices $E_i$ to determine if the corresponding potential error event is self-terminating, for example as described hereinabove with reference to equations (1)-(4), and if it is not, then augmenting $E_i$ with one or more nearby bit indices from previous events, {$E_m$}, m<i to make $E_i$ self-terminating. If $E_i$ cannot be made self-terminating, then the original $E_i$ may be accepted.

Once the set $E_i$ of bit location indices for an $i^{th}$ potential error event is identified, the control may be transferred at block 507 to the event state processor 252 for computing the event state $SE_i$ for the $i^{th}$ potential error event using the bit location indices in $E_i$. This may be done, for example, by performing a XOR addition of stored bit state values $SB_k$ corresponding to the bit location indices in $E_i$. For this purpose, the bit state memory 274 may have pre-computed bit state values $SB_k$ for all bit location indices k=1, ..., K stored therein, which can be accessed by the event state processor 252 as required. If at block 508 it is found that i<I, then at block 509 the event index i is incremented, and the control goes back to block 505.

At block 512, the ECS processor 254 examines if the current event combination state $SC_j$ indicates the absence of EDC detectable errors; for a conventional EDC, this corresponds to examining if the condition $SC_j$=0 holds. If it does, this indicates the absence of EDC detectable errors for d modified at symbol locations corresponding to the event combination $C_j$. In this case, the processing proceeds at block 515 to determine, based on the current event combination index j, the selected event combination $C_j$ corresponding thereto, i.e. to determine the set of event indices corresponding to the $j^{th}$ event combination. This set of indices $C_j$, or the corresponding set of symbol location indices, is then passed to the DCP 240 for modifying the original decision set d using the events in $C_j$. The resulting modified decision set d', or a corresponding modified decision set D', is then provided to the output of the ECP 170.

The ECS loop 510-514 may operate as follows. An event combination index j may first be assigned an initial value of 1 at block 510. At block 511, an EDC state $SC_j$ for a current, i.e. $j^{th}$ event combination $C_j$ is computed; this may be done recursively using a previously computed event combination state $SC_m$, m<j, and one of the event states $SE_i$, stored in the event state memory 276. The event combination index m of the previously computed event combination, the event index i, and the event combination $C_j$={$C_m$, i} may all be uniquely determined by current event combination index j, so it is not necessary to keep track of the event indices associated with each event combination index j. In a first iteration of the ECS loop, i.e. for j=1, m=0, so that $C_1$={$C_0$, i}=i, and $SC_1$ is found by a modulo-two addition of the initial ECS value $SC_0$ and $SE_i$.

At block 512, the ECS processor 254 examines if the current event combination state $C_j$ indicates the absence of EDC detectable errors; for a conventional EDC, this corresponds to examining if the condition $SC_j$=0 holds. If it does, this indicates the absence of EDC detectable errors for d modified at symbol locations corresponding to the event combination $C_j$. In this case, the processing proceeds at block 515 to determine, based on the current event combination index j, the selected event combination $C_j$ corresponding thereto, i.e. to determine the set of event indices corresponding to the $j^{th}$ event combination. This set of indices $C_j$, or the corresponding set of symbol location indices, is then passed to the DCP 240 for modifying the original decision set d using the events in $C_j$. The resulting modified decision set d', or a corresponding modified decision set D', is then provided to the output of the ECP 170.

If at block 512 it is found that $SC_j$≠0, or that the $SC_j$ value indicates the presence of errors, the ECS processor 254 continues processing at blocks 513 and 514, where the event combination index j is compared with its pre-determined maximum value J−1, and if j<(J−1), then the event combination index j is incremented, and the processing returns to block 511.

If by the end of the iterations, when j=J−1, no event combinations indicating the absence of errors is found, the initial decision data set d may be outputted by the DCP 240, or a decoding failure may be signaled to the user.

As stated hereinabove, the processing at block 503 may require a partial sorting of the K reliability values in R. Those skilled in the art will appreciate that a full sort can be performed using order $K \cdot \log_2(K)$ operations. This is an upper bound on the complexity of the processing at block 503, since in preferred embodiments of the method I<<K. The partial sort processing at block 503 is typically less than that required for a single max-log-APP decoding. Moreover, in the context of a turbo decoder that employs many stages of SISO processing, this partial sort processing becomes a fairly insignificant part of the overall decoding if performed only once or a few times as described hereinbelow in further detail.

The purpose of processing at blocks 505 through 509 is to find I weak self-terminating events $\{E_i\}$ that correspond to the I weak, or weakest reliability values $\{W_i\}$, and to compute the I corresponding EDC event states $\{SE_i\}$. For I<<K, this typically requires much less processing than that performed at block 503.

The purpose of the ECS loop at blocks 511 through 514 is to test the initial decisions d with various event combinations $\{C_j\}$ to see if the EDC can be satisfied. This is done by computing the EDC event combination states $\{SC_j\}$ in a recursive manner. The effect of the initial decisions d is included in every test by setting $SC_0=SD$ at block 502. Even though the maximum number of tests in the ECS loop is J, this processing stops whenever the EDC is satisfied. With J>>K, the peak complexity of the event cleanup processing may be dominated by this ECS loop. If the objective is to minimize the average processing, then the processing at blocks 505 through 509 may be integrated with that at blocks 511 through 513 so that weak events are only found when needed, i.e. within the ECS loop. In either case, at typical operating SNRs, the average processing overhead that is associated with the event cleanup processing as described hereinabove with reference to FIG. 7 is very low compared to the processing at the SBSO decoder, because the EDC is usually satisfied for j<<J with high probability.

Those skilled in the art will appreciate that the ECS processing at block 511 may be implemented in a variety of ways, such as by selecting different orders in which events are added to event combinations, and event combinations are constructed and examined. Preferably, the event combinations should be constructed and ordered according to their decreasing probability of occurrence. This approach may however not be very practical and excessively expensive computationally. For example, an optimal order may depend on the data block size K, the punctured code rate, the specifics of the interleaver used in the encoding and related turbo code distance properties, the operating SNR, the stage of SISO processing in the turbo decoder, and the unknown correlation between the weak events themselves.

Advantageously, we have found that a simple approach to the construction of the event combinations that is based on an expanding binary tree works very well for I<10. For I>10, a small initial binary tree followed by one, two or three, depending on the value of J, extensions into the stronger of the weak events provides a practical solution with good performance.

An exemplary method of generating event combinations to be tested for EDC detectable errors, which starts with an expanding binary tree, will now be described. First, the maximum number T of weak events for the binary tree is selected, so that T≤I. Next, the event combination states $SC_j$ for the binary tree are computed recursively as described hereinbelow, where the "+" symbol means a single EDC state add (word XOR) operation.

The ESC generation loop starts with computing the first event combination state $SC_1$ by adding the first event state $SE_1$ corresponding to the weakest reliability value $W_1$ to the initial event combination state $SC_0=SD$, i.e. $SC_1=SC_0+SE_1$. Next, the second event state $SE_2$ corresponding to the second weakest reliability value $W_2$ is added to all previously computed ECS values to give $SC_2=SC_0+SE_2$ and $SC_2=SC_1+SE_2$. Next, the third event state $SE_3$ corresponding to the third weakest reliability value $W_3$ is added to all previously computed ECS values to give $SC_4=SC_0+SE_3$, $SC_5=SC_1+SE_3$, $SC_6=SC_2+SE_3$ and $SC_7=SC_3+SE_3$.

This binary tree building process is continued up to adding $SE_T$ to all previously computed ECS values. The number of ECS values doubles with each newly added potential error event, giving a total of $2^T$ event combination states. Each newly computed ECS value $SC_j$ is tested for errors as described hereinabove with reference to block 512 in FIG. 7, and the ECS generation stops if it is found that $SC_j=0$.

Advantageously, the event indices associated with a $j^{th}$ event combination may be easily determined directly from the combination index j. Expressing j in binary notation, the event indices correspond to the non-zero bits in j, where the least significant bit (LSB) corresponds to event $E_1$ and the most significant bit (MSB) corresponds to event $E_T$. For example, the 83-rd event combination, wherein j is 83 in decimal notation and is 1010011 in binary notation, is given by $C_{83}=\{1,2,5,7\}$; that is, the event indices of all potential error events associated with the event combination are given by the non-zero bit locations in the binary notation of the event index j. Thus, the process of ECS generation does not require the actual construction of all $C_j$ and storing all the event indices associated therewith. Accordingly, in this embodiment the index set $C_j$ is determined only for the last value of j, when $SC_j=0$, i.e. for the selected event combination that corresponds to the absence of EDC detectable errors in the decision data set that is modified therewith.

With the extension of one additional event $E_i$ for i=T+1, . . . I, event state $SE_i$ is simply added to the previous $2^T$ binary tree results to generate $2^T$ more results for each new event index i. Again, although slightly more complicated, it is a simple matter to derive $C_j$ from j, when needed. Additional extensions can also be handled in a straightforward manner, where the limits of the additional extensions (always less than I) are specified by additional parameters. It was found that using three extensions is usually a good choice for large, but still practical, values of I and J, for example for I in the range of 20 to 100, and J in the range of 1,000 to 1,000,000, although these ranges may depend on application.

In the description hereinabove, exact integer arithmetic processing with high resolution have been assumed. In practical applications, the received values V are quantized to integers using a finite number of bits. There are two potential complications associate with this quantization. The first complication is that some of the output LLRs, e.g. as defined by equations (5) and (6), and thus some of the reliability values in R, could be exactly zero. This also means that some of the signs in D could be ambiguous. The result is that the initial decisions in d might not actually correspond to a valid maximum likelihood (ML) sequence. A solution to this problem in turbo decoding, which in the context of using ML sequences for the early stopping of turbo codes was described in K.

Gracie, A. Hunt, and S. Crozier, "Performance of turbo codes using MLSE-based early stopping and path ambiguity checking for inputs quantized to 4 bits," in 4th *International symposium on Turbo Codes and Related Topics*, Munich, Germany, Apr. 3-7, 2006, may be to continue the iterations of the turbo decoder until all the output LLRs are non-zero. This approach could also be applied in the method of the present invention. However, it may not always be sufficient for the event cleanup decoding because, occasionally, some LLRs may still be exactly zero after a pre-determined maximum number of half-iterations in the turbo decoder, $H_{max}$, is reached. A better solution that usually requires less overall processing on average, is to simply treat each bit location index k for which $R_k=0$ as a separate weak potential error event. In effect, in this situation the event cleanup processing performs bit flipping (BF) for a few weak bits where $R_k=0$, in combination with the aforedescribed event cleanup for the other weak events, but only when this situation occurs.

The second complication resulting from the quantization of the received signal is that multiple weak potential error events may have identical, i.e. tied, weak reliability values. When this happens, two or more weak potential error events may initially be interpreted as a single larger weak potential error event. This problem is easily solved if the "true" weak constituent code potential error events are widely spaced, for example by more than 50 symbol intervals, depending on the code used, distance properties of the code, and block length K, among other factors, in which case they are easily identified. If the events are close together, this complication may be effectively handled for RSC codes by performing simple searches for subsets of indices that are self-terminating, for example by starting from one end of the set of indices that are initially identified as related to a same potential error event, and processing the indices sequentially. We found that low complexity search techniques are usually sufficient, and the method provides a substantial performance improvement as the probability of error due to unresolved tied events is typically not the dominant source of error. Even when some tied events are not fully resolved, the correct solution is often found anyway because it does not involve these events. In embodiments with turbo decoding, attempting the event cleanup after multiple half-iterations in the turbo decoder also helps to mitigate this problem, as ties between the reliability values associated with different potential error events rarely persist.

Figure 8:
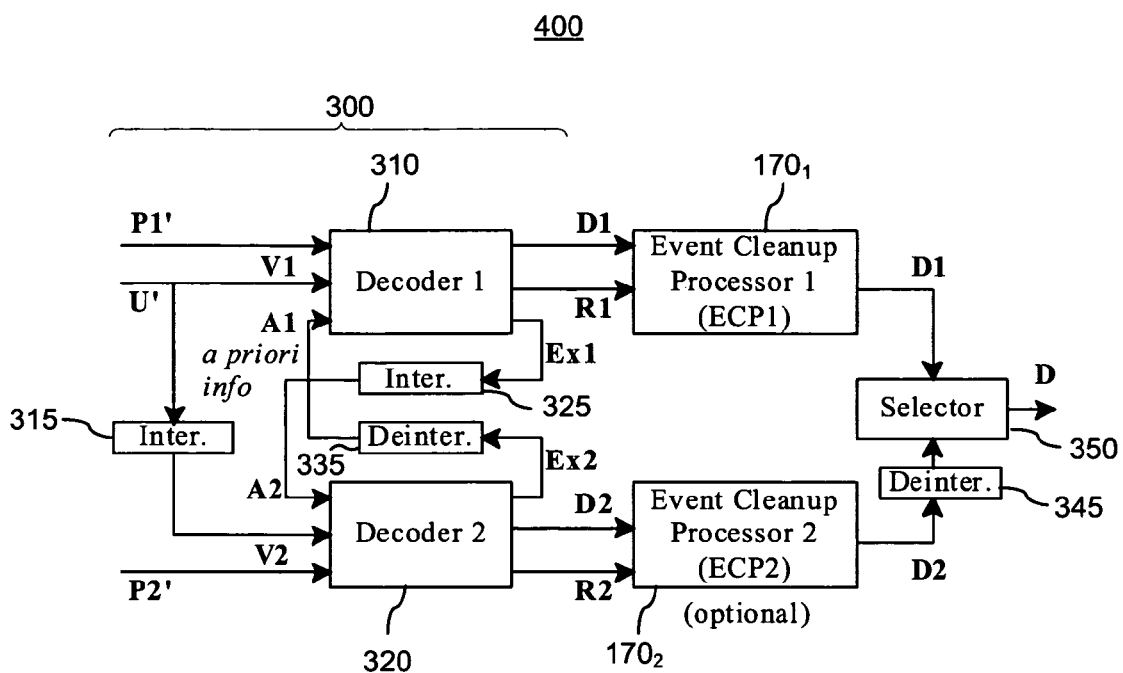
FIG. 8 is a schematic block diagram of the event cleanup decoder including a turbo decoder.

Referring now to FIG. 8, an embodiment of the present invention provides an ECD 400 wherein the ECP 170 is utilized in combination with a turbo decoder 300. As shown, the turbo decoder 300 has two constituent SBSO decoders 310 and 320, which are matched with respective constituent encoders such as the encoders 100 and 104 of the turbo encoder of FIG. 1, and are also referred to hereinafter as a first and second constituent decoder (CD), respectively. The turbo decoder 300 also includes two interleavers 315 and 325 and a deinterleaver 335, which are matched to the interleaver 102 of the corresponding turbo-encoder of FIG. 1. Two instances of the ECP 170 are shown, the ECP1 170₁ that is connected after the first SBSO decoder 310 and the ECP2 170₂ that is connected after the second SBSO decoder 320 and is followed by a deinterleaver 345. A selector unit 350 is connected to provide an output of either one of the ECP instances 170₁ and 170₂ to an output port of the ECD 400. Note that in the shown embodiment the constituent SBSO decoders 310, 320 utilize a SISO decoding algorithm such as the max-log-APP. In the absence of the ECPs 170₁ and 170₂, the turbo decoder 300 is a conventional turbo decoder which operates as known in the art. Briefly, each of the constituent decoders 310, 320 receive the set U' of received data symbols, or bits, which correspond to the transmitted data symbols U but may be corrupted by noise, and a corresponding corrupted set P1' or P2' of parity symbols, or bits, respectively. In a first stage of the turbo-processing, which is also commonly referred to as a half-iteration for turbo decoders with two constituent decoders, the first CD 310 performs the SBSO decoding based on the corresponding constituent code, and outputs the decision data set D1, a set of extrinsic values Ex1, and optionally, a reliability data set R1. The extrinsic values of the set of extrinsic values Ex1 are then interleaved by the interleaver 325, and passed as the a priori information to the second CD 320. In a second half-iteration, or stage, of the turbo processing, the second CD 320 utilizes the received a priori information and the received data and parity symbols to generate the decision data set D2, a set of extrinsic values Ex2, and optionally, a reliability data set R2. The set of extrinsic values Ex2 is in turn provided to the first CD 310 after passing through the deinterleaver 335, to complete one iteration of the turbo decoding. In a conventional turbo decoder configuration, the iterations continue through multiple decoding stages until an error detector (not shown) indicates the absence of errors for one of the decision data sets D1 or D2, or until a stopping rule stops the decoding process, or until a maximum number of iterations is reached.

With the ECPs 170₁ and 170₂ connected after the CDs 310 and 320, respectively, the decision and reliability data sets generated by the CDs can be used by the respective ECPs to perform the event clean-up processing of the decision data sets D1 and/or D2 as described hereinabove. However, the event cleanup does not have to be attempted after every half-iteration in the turbo decoder, as it may increase the amount of cleanup processing relative to the amount of turbo decoder processing. Furthermore, if the EDC used is weak, the error detector in the ECP 170₁,₂ may produce false early accepts, which could degrade performance, especially when the maximum number of ECS tests J is set high. Although a stronger EDC may help, it would unnecessarily increase the number of the EDC overhead bits and thus also increase the complexity of the EDC processing.

Accordingly, the event cleanup processing may preferably be performed once or a few times as required, after the turbo decoder 300 has completed a number of iterations and when the probability of having to test a large number of event combinations is low. This keeps both the peak and average amounts of the event cleanup processing low and also keeps the required number of EDC overhead bits low.

Note that in embodiments wherein all the constituent codes that the turbo decoder 300 decodes are identical, a single SBSO decoder can be used at each SISO stage, or half-iteration, of the turbo processing, switching the extrinsic information at the decoder output between interleaving and deinterleaving feedback loops after each stage, as known in the art. Accordingly, it will be appreciated by those skilled in the art that only one instance of the ECP 170 after the single SBSO decoder is then required, and the selector 350 may be replaced by a switch that switches the deinterleaver 345 in an out of the output path. It will be understood that in these embodiments, the two decoder blocks and two ECP blocks shown in FIG. 8 is just a convenient representation of both half-iterations of the turbo processing in the case of two constituent codes.

In one embodiment of the event cleanup method of the present invention, the turbo decoder 300 first performs close to the maximum number $H_{max}$ of half-iterations, and the event cleanup is turned on for the last few half-iterations, for example 1, 2 or 4, with the turbo processing stopping when the EDC is satisfied, and the resulting modified decision set is output. This regime of operation may work well providing considerable improvement in the error rate performance, when $H_{max}$ is not set too high, for example less than 16 to minimize the peak turbo decoder processing, or when operating in the low-SNR waterfall region. However, when operating in the error flare region of the BER curve, and/or with $H_{max}$ set relatively high, this approach may have drawbacks. First, there tends to be an optimal number of half-iterations in turbo decoding. It has been found that the weakest reliability values at the output of a half-iteration of max-log-APP processing are more likely to correspond to the actual error events shortly after convergence has essentially been achieved, rather than later. This is not too surprising since once the turbo decoder is committed to an erroneous sequence, further processing will tend to reinforce its decision. Second, turning on the event cleanup earlier and preferably near the optimal number of iterations will not only reduce the average amount of cleanup processing but will also reduce the average number of half-iterations required.

Accordingly, in one embodiment the turbo decoder 300 first performs Q>1 initial stages of SBSO decoding before the ECP 170$_1$ or 170$_2$ starts performing the event cleanup processing, or at least prior to computing the ECSs. The decision data set d obtained in the $Q^{th}$ decoding stage is passed to the respective ECPs 170$_1$ or 170$_2$, and the event cleanup processing starts after the turbo decoder 300 has performed Q half-iterations. In one embodiment, the number Q is determined dynamically during the iterative decoding using an event cleanup turn-on rule.

In one embodiment, the number Q of the initial SBSO decoding stages is determined dynamically during the iterative decoding in dependence upon a number of the decisions $d_k$ that changed between a current SBSO decoding stage and a preceding SBSO decoding stage, as follows. This can be done by updating, after each half-iteration of the turbo-decoding, the number of additional half-iterations $H_{add}$ that are to be performed beyond the current half-iteration before turning on the event cleanup in the ECP. The updating may be based for example on the following equation (7), starting with $H_{add}=H_{max}-H_{EF}+1$, where $H_{EF}$ is a pre-defined maximum number of half-iterations with the event cleanup turned on:

$$H_{add}=\min(H_{add}-1, \text{floor}(F \times B+G)). \quad (7)$$

Here, B is the number of the decisions $D_k$ in the decision data set D1 or D2 that are different between the current and previous half-iterations, and F and G are factor and offset parameters that can be optimized for a given operating scenario. Accordingly, in this embodiment the number of additional half-iterations to be executed before turning on the event cleanup processing is the minimum of one less than the $H_{add}$ determined last time and the integer part of (F×B+G) computed this time. We found that F=½ and G=2 tends to work well when operating in the error flare region with $H_{EF}=1$. With $H_{EF}=2$, G=1 is usually a good choice. With $H_{EF}=4$ or higher, G=0 tends to work well.

By way of example, we consider an ECD that operates with $H_{EF}=2$, F=½, G=1. During the turbo decoding iterations the parameter $H_{add}$ was computed to be high, due to B being much larger than 1, for all previous half-iterations, but after the last performed half-iteration the number B of decisions that differ this time is 0. Then $H_{add}$ for the current half-iteration is computed to be $H_{add}=G=1$. This means that only one more half-iteration will be performed before turning on the event cleanup processing of the corresponding decision data set. If instead the number of decisions that differ is B=2 or 3, which is typical of when the decision sequences differ by a single error event, then $H_{add}=2$, so that two more half-iterations will be performed before turning on the event cleanup. We consider now another example wherein $H_{EF}=4$, F=½, G=0 and B=0 for the current half-iteration. Then $H_{add}=0$ and event cleanup is turned on immediately. That is, the event cleanup processing is applied to the output of the current half-iteration, i.e. either the D1, R1 or D2, R2 and to the following three half-iterations if needed. Note that, even if B never becomes zero, the event cleanup will be turned on shortly after B becomes small, and likely at or near the optimal number of the SBSO stages of the turbo processing.

Advantageously, we found that the aforedescribed turn-on rule for the event clean-up processing of the SBSO decoding output, in combination with the EDC used with event cleanup, is an effective strategy for early stopping of the over-all decoding process. Thus, while the peak processing may increase slightly by including event cleanup after a few half-iterations, the average over-all processing is typically reduced, especially in the error flare region where the average number of half-iterations is typically well below $H_{max}$.

Decoding Complexity Estimation

As explained hereinabove, the peak event cleanup complexity is typically dominated by the J simple state add (word XOR) operations used to test the J candidate event combinations. These operations are similar in complexity to the simple add, compare, select and update operations used in a Viterbi decoder, or a max-log-APP decoder, and all such operations can be counted as equivalent. A Viterbi decoder typically requires 4 such operations per state metric update. Thus, a Viterbi decoder, with state metric updating and storage, but without history updating and storage, with S trellis states per data bit index, and K data bits per block, has a complexity of order 4SK operations. A max-log-APP decoder requires a forward Viterbi pass, a backward Viterbi pass, and a metric combining pass, with a total computational complexity roughly 3 to 4 times that of a single Viterbi pass. Thus, a half-iteration of max-log-APP processing has complexity roughly of the order of 16SK. As an example, with S=4 states and K=2048 data bits, the complexity of one half-iteration of max-log-APP processing is of the order of $2^{17}$ operations. For a turbo decoder with $H_{max}=32$, the percentages of peak overhead processing for the event cleanup with $J=2^{18}$ and $H_{EF}=1$, 2, or 4, are about 6%, 12.5%, or 25%, respectively. Thus, selecting the maximum number J of the event combinations to test on the order of $2^{18}$ would not lead to an unreasonably large computational overhead associated with the event cleanup processing, and may be advantageously utilized. Furthermore, these peak overhead percentages are halved for S=8 state constituent codes; they are also inversely proportional to the data packet length K. In practice, the event cleanup processing of the present invention as described hereinabove typically reduces the average amount of total processing, especially in the error flare region, due to the early stopping of the turbo decoder with the event cleanup post-processing.

Performance Results

Figure 9:
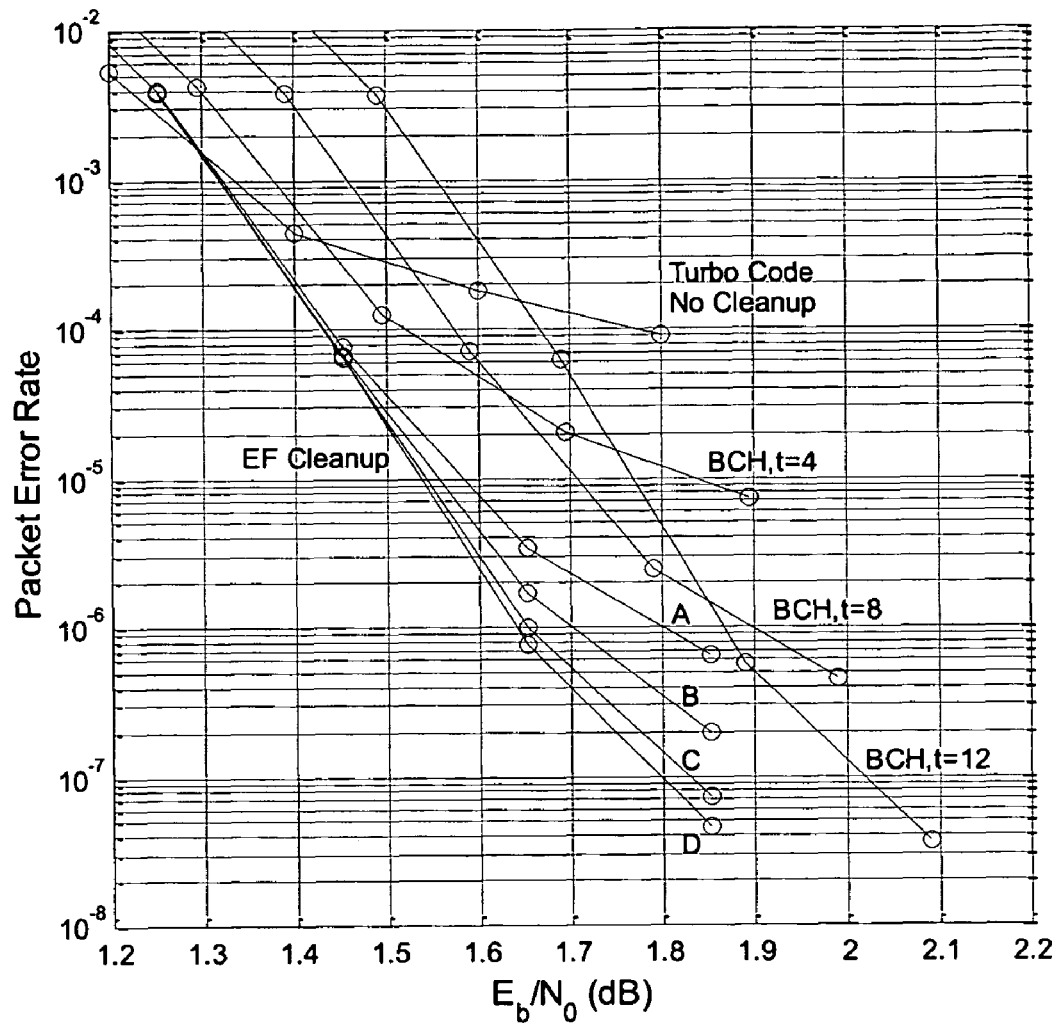
FIG. 9 is a graph illustrating simulated packet error rate performance of an event cleanup decoder according to the present invention in comparison with prior art decoding approaches utilizing identical turbo decoders.

FIG. 9 shows the packet error rate (PER) performance vs. SNR curves obtained using a turbo decoder for decoding a conventional parallel concatenated turbo code with and without error cleanup post-processing of the decoder output according to the present invention. The turbo code used two single-binary, 4-state, RSC constituent codes, where the feedback (FB) and feedforward (FF) polynomials are (FB,FF)= (7,5) in octal. Binary antipodal signaling and an additive white Gaussian noise (AWGN) channel model were used in simulations. The PER results are presented versus an SNR defined in terms of $E_b/N_0$ in dB where $E_b$ is the energy per information bit and $N_0$ is the single-sided noise power spectral density. The data block and interleaver size is K=2048 bits and the punctured codeword size is N=4096 bits. Thus, the nominal code rate with puncturing is r=K/N=½. The actual code rate is somewhat lower and is case dependant. With the BCH cleanup code, the overall code rate depends on the number of BCH parity bits. With the event cleanup according to the present invention, the code rate depends on the number of EDC check bits used. The nominal code rate of ½ was obtained using 50% data puncturing because this provided much better performance than parity puncturing alone. The interleaver was a high spread random (HSR) interleaver constrained to match the data puncture mask. The constituent code decoder used enhanced max-log-APP processing with an extrinsic information scale factor of 0.75. A scale factor of 1.0 was used with the event cleanup turned on. The maximum number of constituent code decodings, or half-iterations, was set to $H_{max}$=32. Ten thousand packet errors were counted at each $E_b/N_0$ value and the corresponding simulation noise seeds were stored for later use. This provided an efficient and consistent way to test and compare the various cleanup strategies. Additional details in parts that are unrelated to the event cleanup processing of the present invention can be found in articles R. Kerr, K. Gracie, and S. Crozier, "Performance of a 4-state turbo code with data puncturing and a BCH outer code," in 23rd *Biennial Symposium on Communications*, Kingston, Canada, May 29-Jun. 1, 2006, Queen's University, and K. Gracie and S. Crozier, "Improving the performance of 4-state turbo codes with the correction impulse method and data puncturing," in *Proceedings of the 23rd Biennial Symposium on Communications*, Kingston, Canada, Queen's University, May 29-Jun. 1, 2006, which are incorporated herein by reference.

The curve labeled "Turbo Code, No Cleanup" shows the turbo code performance without any cleanup post-processing after the turbo decoding to reduce errors. Note that the turbo code performance is well into its flare region at the SNR of 1.8 dB where the PER is about $10^{-4}$. Curves labeled "BCH, t=4", "BCH, t=8", and "BCH, t=12" depict results achieved for the same turbo code decoder with a BCH cleanup code for t-error correcting BCH codes with t=4, 8, and 12. The required numbers of BCH parity bits, given by 11t, are 44, 88 and 132, respectively. Thus, the actual code rates, given by (2048-11t)/4096, are 0.489, 0.479 and 0.468, respectively. The corresponding SNR penalties, given by $10 \times \log_{10}(2048/(2048-11t))$ dB, are 0.094, 0.191 and 0.289 dB, respectively. These penalties have been included for the three BCH cleanup result curves shown in FIG. 9.

Curves labeled with case labels "A", "B", "C" and "D" depict results achieved using the event cleanup processing of the output of the turbo decoder according to the present invention, as described hereinabove with reference to FIGS. 7 and 8, using the event cleanup turn-on rule as described hereinabove with reference to equation (7), and with differing parameters I, J, and $H_{EF}$ of the event cleanup processing. Continuing with the notations used hereinabove wherein I is the maximum number of the weak potential error events considered, J is the maximum number of event combinations considered, and $H_{EF}$ is the maximum number of half-iterations with EF cleanup turned on, case "A" refers to I=22, $J=2^{10}$, $H_{EF}=1$; case "B" refers to I=64, $J=2^{18}$, $H_{EF}=1$; case "C" refers to I=64, $J=2^{18}$, $H_{EF}=2$; and case "D" refers to I=64, $J=2^{18}$, $H_{EF}=4$.

The peak event cleanup complexity is mainly determined by the J and $H_{EF}$ parameters. As a percentage of the peak turbo decoder complexity, the peak event cleanup complexities are roughly <1%, 6%, 12.5% and 25%, respectively.

Although a genie, i.e. ideal EDC was used for the simulations, it was determined from the results that a 24-bit EDC should be sufficient. In fact, a 16-bit EDC is sufficient for case A. Assuming a 24-bit EDC, the actual code rate is (2048-24)/4096=0.494, and the corresponding SNR penalty is $10 \times \log_{10}(2048/(2048-24))$=0.051 dB. This penalty has been included for all four event cleanup results shown in FIG. 9. Note that event cleanup case A, with very little processing overhead, provides about the same improvement in flare performance as a t=8 BCH cleanup code, but with a higher code rate and a smaller SNR penalty. Similarly, the event cleanup case D provides about the same improvement in flare performance as a t=12 BCH cleanup code, again with a higher code rate and a much smaller SNR penalty. The PER for case D is well below $10^{-7}$ at 1.85 dB, for an improvement of more than three orders of magnitude. This is exceptional flare performance for a 4-state turbo code.

Straightforward bit flipping (BF) cleanup was also investigated. It was found that BF with $H_{BF}=1$ and a maximum of $J=2^{20}$ tests provided about the same performance as the event cleanup case "A" with $H_{EF}=1$ and a maximum of $J=2^{10}$ tests. Thus, for this example, the BF peak complexity is about 1000 times the peak complexity of the event cleanup processing according to the present invention. Furthermore, the BF approach requires at least 10 more EDC check bits than the event cleanup approach to achieve the same performance.

Accordingly, it has been demonstrated that the event cleanup processing according to the present invention advantageously enables achieving a much improved PER performance for the same amount of overhead processing, or to considerably reduce processing overhead for the same PER performance, as the prior art error cleanup post-processing of the decoded data.

It should be understood that the embodiments described hereinabove are non-limiting and exemplary and have been presented for the purpose of illustration and description, and many modifications and changes may be envisioned within the scope of the present invention in light of the preceding description.

For example, in the embodiments described hereinabove, the construction and testing of the event combinations is stopped once an event combination corresponding to the absence of EDC detectable errors in the correspondingly modified decision data set is found. However, in another embodiment the construction and testing of the event combinations may continue, and if several event combinations are found that satisfy the EDC, then additional processing can be implemented to select a "best" event combination from this set. For example, candidate decision data sets obtained by modifying the initial decision data set d at indices corresponding to each of these event combinations could be re-encoded, and the corresponding codewords correlated with the received channel values, V. The modified decision data set that provides the highest correlation is the most likely data sequence from among this set of candidates, and can be provided as the output of the ECD. In effect, maximum likelihood (ML) sequence estimation is used to select the most likely data sequence from the set of candidates that were found to satisfy the EDC. This approach increases the average event cleanup processing, but does not significantly increase the peak event cleanup processing if the number of candidate data sequences that satisfy the EDC is limited to a small number. In this embodiment, the number of EDC check bits that is required to achieve the results shown in FIG. 9 for the event cleanup cases A and D could be reduced from 16 and 24 to about 8 and 16, respectively.

The results in FIG. 9 were obtained using enhanced max-log-APP decoding (with scaled extrinsic information) for each and every half-iteration of SISO processing in the turbo decoder. Max-log-APP decoding was effectively used when EF cleanup was turned on, by simply changing the extrinsic information scale factor to one. True log-APP decoding is more complex than enhanced max-log-APP decoding, but it provides better performance, especially in the waterfall region. Thus, a good hybrid approach is to use log-APP decoding initially and then switch to enhanced max-log-APP decoding once convergence has essentially been achieved and EF cleanup is turned on. The proposed EF cleanup turn-on rule is well suited to this approach.

Turbo codes can be constructed using two or more constituent codes separated by one or more interleavers. Turbo codes can also be constructed using serial instead of parallel concatenations. The event cleanup processing according to the present invention can be applied to any of the corresponding iterative decoders by applying it to the output of any constituent code stage of the SISO decoding that uses a sequence-based decoding algorithm, such as the max-log-APP processing and SOVA processing.

Furthermore, the data symbols do not need to be single-binary bits. The data symbols could be non-binary, with 3 or more symbol values, or they could be multi-binary symbols. For example, the recent digital video broadcast—return channel satellite standard DVB-RCS uses double-binary symbols in the turbo code design. As skilled in the art will appreciate, the aforedescribed event cleanup approach can be easily extended to these more general cases, provided that the constituent error correction codes and the EDC code remain linear so that candidate data sequences can still be obtained by "adding" weak potential error events together, and EDC states can still be computed by "adding" other EDC states together. The "addition" operation is defined by the linear definition for each code. Note that a multi-binary turbo code would still typically use a single-binary EDC code to protect the binary data.

The event cleanup approach of the present invention is also applicable to other turbo-like codes such as serial-concatenated turbo codes (SCTC) and low-density parity check (LDPC) codes. LDPC codes are defined using a set of single parity check (SPC) constraints. In fact, a single SPC constraint can be viewed as a 2-state RSC code where only the final parity check bit is kept. With max-log-APP decoding of each SPC code, the weakest error events always involve two data bits, as discussed hereinabove. Thus, the event cleanup can be easily applied to the decoding of LDPC codes by selecting a set of weak events from any subset of SPC constraints that covers most or all of the data portion of the LDPC code once. The EDC could be a separate code embedded in the data portion only, or, if the LDPC code is powerful enough, the LDPC code itself could be used for error detection. The former is usually simpler to implement, but the latter requires fewer overhead bits. Similarly, the event cleanup of the present invention can also be applied to other turbo-like codes such as turbo product codes (TPCs), again with simple SPC constraints, or with more complex constituent codes such as Hamming codes, extended Hamming codes, BCH codes, or extended BCH codes, as would be obvious to those skilled in the art in light of the present description.

The event cleanup decoding of the present invention can be advantageously used in many application and computing environments where sequence-based decoding is or can be implemented. One typical application is a wireless or wireline communication system that is generally illustrated in FIG. 10. A transmitting system 120 includes an encoder 122, followed by a modulator 124, which may include one or more frequency up-conversion circuits as known in the art, and a transmitter 126. The transmitting system 120 generates an electrical, including in different embodiments electromagnetic or optical, communication signal S(t). This communication signal is received by a receiving system 140 after propagation through a communication channel 130, which may include a wireless and/or wireline network, and which may distort the communication signal causing information data carried by the communication signal to become corrupted. The receiving system 140 includes a receiver 142, an SBSO decoder 144, such as the decoder 300 described with respect to FIG. 8 or the decoder 160 described with respect to FIG. 3, followed by the ECP 146 such as the ECP 170 described with respect to FIG. 4 or 6, and an output device or component 146 for rendering decoded data, such as a video and/or audio terminal, a memory device, etc. The transmitting system 120 may be embodied using any type of computer or electronic device that is capable of transmitting digital data over the communication channel 130. The communication channel 130 may include any type of data communication network, including a wireless network, e.g., telephone communication system, cellular communication system, digital radio, digital television, satellite, infrared, etc., or a wired network, e.g., the Internet, an Intranet, Local Area Network (LAN), storage area network (SAN)), or a combination of two or more thereof. Similarly, the receiving system 140 may be embodied using any type of computer or electronic device that is capable of receiving digital data over the communication channel 130.

The encoder 122 receives a digital electrical signal carrying an information bit sequence from a data source 110, and encodes the information bit sequence using an EDC and an ECC to generate one or more data codewords formed of data symbols and overhead symbols such as parity symbols. The encoder 122 outputs an encoded electrical signal carrying encoded data in the form of a sequence of the data codewords; this encoded electrical data signal may then be used by the modulator 124 to modulate an electrical or optical carrier using a selected modulation format, with the resulting communication signal transmitted over the network by the transmitter 126.

In the receiving system 140, the transmitted communication signal, which may have been corrupted during the propagation by noise, interference, transmission non-linearity and alike, is received by the receiver 142. The receiver 142 incorporates a data receiving component including an analog to digital converter for sampling the received communication signal for converting the received communication signal into a sequence or set of received samples representing the transmitted codeword, and may also include a de-modulator, one or more frequency down-conversion circuits, and an amplifier. The SBSO decoder 144 then attempts to recover the data portion of the transmitted signal with a minimum number of errors to generate the decoded data including the decision and reliability data sets, which are then processed by the ECP 146, for example as described hereinabove with reference to FIGS. 4 to 7, so as to further reduce or eliminate the number of EDC-detectable errors in the decoded data as described hereinabove. The decoded data modified by the event cleanup processing in the ECP 146 is then provided for rendering to the output device or component 148, such as a video and/or audio terminal, a memory device, etc, and for presenting to the user.

The SBSO decoder 144 and the ECP 146 may be implemented as software modules that are executed by a hardware processor within the receiving system 140 such as a microprocessor, a DSP, a general purpose processor, or as hardware logic, e.g., an ASIC, an FPGA, etc.

FIG. 11 illustrates another implementation including a storage medium 600 having data 610 stored therein. The storage medium 600 may be, for example, a removable storage medium, such as tape cassette, optical disk, swappable disk, solid state flash memory etc., or non-removable storage medium, for example one or more hard disk drives, solid state drives, etc.,. One concern with archiving data for extended periods of time is corruption of the stored data resulting from physical defects that occur in the storage medium 600 over time. Data corruption may also occur in the process of writing the data onto the storage medium, or accessing the stored data. To facilitate data recovery, the data 610 has been encoded with an EDC code and an ECC code to form one or more data codewords. A computer 650 accesses data in the storage medium 600, including the encoded data 610, via a storage device 620, such as a tape drive, optical disk drive, disk drive interface, etc. The storage device 620 functions as a data receiving component for the computer 650 and includes an analog to digital converter for sampling a data signal generated by accessing the encoded data 610 in the storage medium 600 to obtain the sequence of signal samples representing the stored codewords. The computer 650 includes a hardware processor 670 including an SBSO decoder 630, such as the decoder 300 described with respect to FIG. 8 or the decoder 160 described with respect to FIG. 3, followed by an ECP 640 such as the ECP 170 described with respect to FIGS. 4 to 7. In operation, the SBSO decoder decodes the encoded data 610, and provides a soft decoding output including decision and reliability data sets to the ECP 640 to perform the event cleanup post-processing of the decoded data, for example as described hereinabove with respect to FIG. 5 or 7. In alternative implementations, the decoder 630 and the ECP 640 may be implemented in the storage device 620, such that the encoding and event cleanup decoding is handled by the storage device 620.

Additional Implementation Details

The SBSO decoder 630 and the ECP 640 may be implemented as software modules that are executed by a hardware processor, such as a microprocessor, a DSP, a general purpose processor, etc., or as hardware logic, e.g., an ASIC, an FPGA, etc.

The event cleanup decoding logic and operations described herein may be implemented as a method, apparatus or article of manufacture using standard programming and/or engineering techniques to produce software, firmware, hardware, or any combination thereof.

One implementation of the invention provides an article of manufacture that comprises at least one of a hardware device having hardware logic and a computer readable storage medium including a computer program code embodied therein that is executable by a computer, said computer program code comprising instructions for performing operations for decoding data that has been encoded using an error detection code (EDC) and an error correction code (ECC) to generate a codeword from K data symbols, wherein K>1, said computer program code further comprising distinct software modules, the distinct software modules comprising a data decoding module implementing a method of SBSO decoding, and an event cleanup processing module comprising an error detection module. As described hereinabove with reference to FIG. 5 and 7, the operations may include: a) receiving a set of received signal samples representing the codeword; b) transforming the set of received signal samples into decoded data using the SBSO decoder, the decoded data comprising a decision data set d of K hard decisions $d_k$ corresponding to the K data symbols, and a reliability data set R of K reliability values $R_k$ associated with the hard decisions, wherein k is a symbol location index of a data symbol in the set of K data symbols, k=1, ..., K, and saving the decision data set and the reliability data set in the memory; and c) providing the decision data set d to the error detector to generate an error detector state (EDS) and, when the EDS indicates the presence of an error in the decision data set, performing the following steps: identifying a plurality of potential error events in the decision data set based on the stored reliability values; computing event combination states (ECS) for the error detector for a plurality of combinations of the potential error events; identifying a selected combination of the potential error events having an ECS indicating the absence of EDC detectable errors; modifying the decision data set d at location indices corresponding to the selected combination of the potential error events to obtain a modified decision data set; and, outputting the modified decision data set for rendering in a data rendering device for presenting to a user.

The term "article of manufacture" as used herein refers to code or logic implemented in hardware logic, for example an integrated circuit chip, FPGA, ASIC, etc., or a computer readable medium, such as but not limited to magnetic storage medium, for example hard disk drives, floppy disks, tape, etc., optical storage, for example CD-ROMs, optical disks, etc., volatile and non-volatile memory devices, for example EEPROMs, ROMs, PROMs, RAMs, DRAMs, SRAMs, firmware, programmable logic, etc. Code in the computer readable medium is accessed and executed by a processor. Of course, those skilled in the art will recognize that many modifications may be made to this configuration without departing from the scope of the present invention, and that the article of manufacture may comprise any information bearing tangible medium known in the art.

It should be understood that each of the preceding embodiments of the present invention may utilize a portion of another embodiment Of course numerous other embodiments may be envisioned without departing from the spirit and scope of the invention.

We claim:

1. A method for decoding data that has been encoded using an error detection code (EDC) and an error correction code (ECC) to generate a codeword from K data symbols, wherein K>1, the method comprising:

a) obtaining a set of received signal samples representing the codeword in an apparatus comprising a sequence-based soft output (SBSO) decoder for decoding the ECC, an error detector for detecting errors using the EDC, and memory;

b) transforming the set of received signal samples into decoded data using the SBSO decoder, the decoded data comprising a decision data set d of K hard decisions $d_k$ corresponding to the K data symbols, and a reliability data set R of K reliability values $R_k$ associated with the hard decisions, wherein k is a symbol location index of a data symbol in the set of K data symbols, k=1, ..., K, and saving the decision data set and the reliability data set in the memory;

c) providing the decision data set d to the error detector to generate an error detector state (EDS) and, when the EDS indicates the presence of an error in the decision data set, performing the steps of:

d) identifying a plurality of potential error events in the decision data set based on the stored reliability values;

e) computing event combination states (ECS) for the error detector for a plurality of combinations of the potential error events;

f) identifying a selected combination of the potential error events having an ECS indicating the absence of errors;

g) modifying the decision data set d at location indices corresponding to the selected combination of the potential error events identified in (f) to obtain a modified decision data set; and, h) outputting the modified decision data set for rendering in a data rendering device for presenting to a user.

2. The method of claim 1, wherein:

(d) comprises:

d1) identifying I weak reliability values $W=\{W_i\}$, $i=1 \ldots I$, from the set of K reliability values R, wherein $I>1$; and, d2) identifying one or more location indices k where $R_k = W_i$ and assigning said one or more location indices to a set $E_i$ of one or more symbol location indices associated with an $i^{th}$ potential error event;

(e) comprises:

e1) obtaining an event state $SE_i$ for an $i^{th}$ potential error event based on the EDC and the set $E_i$ of location indices associated therewith, e2) recursively computing one or more event combination states (ECS) $SC_j$ for one or more event combinations, wherein an invent combination index $j=1, \ldots J-1$, wherein J is an integer greater than 1, using a previous ECS $SC_m$ wherein $m<j$ and the event state $SE_i$, and using the EDS generated in (c) as an initial ECS $SC_m$ with $m=0$.

3. The method of claim 2, wherein (f) comprises f1) examining the $j^{th}$ event combination state $SC_j$ to determine the absence of EDC detectable errors, and f2) determining location indices k for the selected combination of the potential error events from the event combination index j of the selected combination of the potential error events.

4. The method of claim 2, wherein the ECC is recursive, the method further comprising:

examining one or more of the potential error events $E_i$ to determine if said error events are self-terminating;

augmenting a potential error event $E_i$ that is not self-terminating with one or more symbol location indices from one or more other potential error events identified in (d2) so as to make the potential error event $E_i$ self-terminating.

5. The method of claim 2, wherein:

(d1) comprises ordering the I weak reliability values W according to their values in ascending order from weakest to strongest; and, (e2) comprises recursively computing the event combination states $\{SC_j\}$ using a method of an expanding binary tree.

6. The method of claim 1, wherein the apparatus comprises a data receiver for receiving a data signal representing the data, and wherein (a) comprises obtaining the set of received signal samples from the data receiver.

7. The method of claim 6, wherein the apparatus comprises a wireless or wireline receiver for receiving a communication signal in a wireless or wireline communication system, and wherein the data receiver comprises an analog to digital converter for sampling the received communication signal for obtaining the set of received signal samples.

8. The method of claim 1, wherein the apparatus comprises a hardware storage device for accessing a tangible computer-readable medium having the data stored therein.

9. The method of claim 1, wherein (b) comprises max-log-APP decoding or a soft-output Viterbi algorithm (SOYA) decoding.

10. The method of claim 1, wherein the apparatus comprises an iterative decoder, the iterative decoder comprising the SBSO decoder as a constituent decoder, for performing an iterative decoding of the ECC, wherein the ECC comprises at least two ECC constituent codes, wherein (b) comprises performing $Q>1$ initial SBSO decoding stages by the iterative decoder to obtain the decision data set d, prior to performing at least step (e).

11. The method of claim 10, wherein the number Q of the initial SBSO decoding stages is determined during the iterative decoding using an event cleanup turn-on rule.

12. The method of claim 11, wherein the number Q of the initial SBSO decoding stages is determined in dependence upon a number of the decisions $d_k$ that changed between a current SBSO decoding stage and a preceding SBSO decoding stage.

13. The method of claim 10, wherein steps (d) and (e) are performed after one or more final SBSO decoding stages of the iterative decoder starting after the SBSO decoding stage Q.

14. The method of claim 13, wherein the first (Q−1) SBSO decoding stages of the iterative decoder use at least one of: SOVA decoding, max-log-APP decoding, enhanced max-log-APP decoding, or log-APP decoding, and the one or more final SBSO decoding stages of the iterative decoder comprises at least one of: SOVA decoding, max-log-APP decoding, or a combination of max-log-APP decoding and enhanced max-log-APP decoding.

15. The method of claim 10, wherein the iterative decoder is for decoding one of a turbo code (TC), a serial-concatenated turbo code (SCTC), a low density parity check (LDPC) code, or a turbo product code (TPC); and, at least one of the ECC constituent codes comprises one of a convolutional code, recursive systematic convolutional (RSC) code, a set of at least two single parity check (SPC) codes, a set of at least two Hamming codes, or a set of at least two BCH codes.

16. The method of claim 1, wherein steps (e), (f) and (g) are repeated to obtain at least two different combinations of the potential error events each having an ECS indicating the absence of EDC detectable errors, and selecting one of the at least two different combinations of the potential error events as the selected event combination according to a pre-defined selection criterion.

17. The method of claim 16, comprising:

modifying the decision data set d at indices corresponding to each of the at least two different combinations of the potential error events to obtain at least two different candidate decision data sets;

re-encoding said candidate decision data sets using the ECC to obtain at least two different codewords;

correlating each of the at least two different codewords with the received set of signal samples; and, selecting one of the at least two different combinations of the potential error events with ECSs indicating the absence of EDC detectable errors that provides a strongest correlation with the received set of signal samples among the respective candidate codewords.

18. The method of claim 1, wherein the EDC comprises one of a cyclic redundancy check (CRC) code, a Hamming code, an extended Hamming code, a BCH code, or an extended BCH code.

19. An apparatus comprising:
a data receiver for receiving a data signal representing data that has been encoded using an error detection code (EDC) and an error correction code (ECC) to generate a codeword from a set of K data symbols, wherein K>1, and for obtaining therefrom a set of signal samples corresponding to the set of K data symbols;
a sequence-based soft output (SBSO) decoder for generating decoded data from the set of signal samples based on the ECC, the decoded data comprising a decision data set d of decision values and a reliability data set R of reliability values corresponding thereto;
an event clean-up processor (ECP) coupled to the SBSO decoder for identifying potential error events in the decision data set based on the EDC, and for generating a modified decision data set without EDC detectable errors, the ECP comprising:
an error detector (ED) coupled to the SBSO decoder for detecting errors in the decision data set based on the EDC;
an event locator for identifying at least two potential error events, each potential error event being associated with a set of one or more locations in the decision data set;
an event information memory coupled to the event locator for storing event information for each of the identified potential error events;
an event combination tester (ECT) coupled to the event information memory for examining one or more event combinations comprising one or more potential error events, and for determining a selected event combination corresponding to the absence of EDC detectable errors in the decision data set; and,
a decision clean-up processor (DCP) coupled to the ECT for modifying decision values corresponding to the selected event combination to generate the modified decision data set having no EDC detectable errors associated therewith.

20. The apparatus of claim 19, wherein:
the event locator comprises:
a reliability sorter for selecting a plurality of I weak reliability values $W_i$, i=1 ... I, from the reliability data set R, where I is at least two;
an event constructor for identifying locations in d associated with a weak reliability value from the plurality of I weak reliability values to construct a potential error event, and for providing a set of location indices for each potential error event to the event information memory for storing therein;
the ECT comprises:
an event state processor for generating I event state values $SE_i$ for the potential error events based on the EDC, wherein i=1, ..., I;
an event combination state (ECS) processor for generating one or more ECS values $SC_j$ for the one or more event combinations based on combinations of the event state values $SE_i$ and an initial ECS value $SC_0$ generated by the error detector in response to the decision data set d, and for providing the selected event combination corresponding to the absence of EDC detectable errors in the decision data set to the decision clean-up processor; and,
the event information memory comprises:
an event memory for storing data symbol locations associated with each potential error event;
an event state memory for storing the event state values $SE_i$; and,
an event combination state memory for storing the ECS values $SC_j$.

21. The apparatus of claim 20, wherein the data symbols are binary bits, and the event information memory further comprises bit state memory for storing a pre-computed bit state value $SB_k$ for each bit location k in the decision data set d, wherein each bit state value $SB_k$ corresponds to an output of the error detector in response to a binary sequence having a single logical '1' at the respective bit location in the binary sequence.

22. An article of manufacture comprising at least one of a device having logic and a computer readable storage medium including a computer program code embodied therein that is executable by a computer, said computer program code comprising instructions for performing operations for decoding data that has been encoded using an error detection code (EDC) and an error correction code (ECC) to generate a codeword from K data symbols, wherein K>1, said computer program code further comprising distinct software modules, the distinct software modules comprising a data decoding module for implementing a method of sequence-based soft output (SBSO) decoding, and an event cleanup processing module comprising an error detection module, said operations comprising:
a) receiving a set of received signal samples representing the codeword;
b) transforming the set of received signal samples into decoded data using the SBSO decoder, the decoded data comprising a decision data set d of K hard decisions $d_k$ corresponding to the K data symbols, and a reliability data set R of K reliability values $R_k$ associated with the hard decisions, wherein k is a symbol location index of a data symbol in the set of K data symbols, k=1, ..., K, and saving the decision data set and the reliability data set in a memory;
c) providing the decision data set d to the error detector to generate an error detector state (EDS) and, when the EDS indicates the presence of an error in the decision data set, performing the steps of:
d) identifying a plurality of potential error events in the decision data set based on the stored reliability values;
e) computing event combination states (ECS) for the error detector for a plurality of combinations of the potential error events;
f) identifying a selected combination of the potential error events having an ECS indicating the absence of errors;
g) modifying the decision data set d at location indices corresponding to the selected combination of the potential error events identified in (f) to obtain a modified decision data set; and,
h) outputting the modified decision data set for rendering in a data rendering device for presenting to a user.

* * * * *